(12) United States Patent
Oishi

(10) Patent No.: US 7,997,814 B2
(45) Date of Patent: Aug. 16, 2011

(54) DIPPING-TYPE AUTOMATIC DEVELOPING APPARATUS AND METHOD FOR LITHOGRAPHIC PRINTING PLATES

(75) Inventor: Chikashi Oishi, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 201 days.

(21) Appl. No.: 12/053,925

(22) Filed: Mar. 24, 2008

(65) Prior Publication Data

US 2008/0232793 A1 Sep. 25, 2008

(30) Foreign Application Priority Data

Mar. 22, 2007 (JP) ................ P2007-075108

(51) Int. Cl.
*G03D 3/02* (2006.01)
(52) U.S. Cl. .................................... 396/626
(58) Field of Classification Search ............. 396/614, 396/626
See application file for complete search history.

(56) References Cited

U.S. PATENT DOCUMENTS

| | | | | |
|---|---|---|---|---|
| 4,401,743 A | * | 8/1983 | Incremona | 430/158 |
| 4,686,083 A | * | 8/1987 | Takizawa et al. | 420/548 |
| 4,851,324 A | * | 7/1989 | Hsieh | 430/331 |
| 5,136,322 A | * | 8/1992 | Ohba et al. | 396/614 |
| 5,797,057 A | * | 8/1998 | Kinoshita et al. | 396/578 |
| 2006/0185543 A1 | | 8/2006 | Sasayama | |
| 2006/0185544 A1 | * | 8/2006 | Sasayama | 101/463.1 |

FOREIGN PATENT DOCUMENTS

| | | |
|---|---|---|
| EP | 0 415 392 A2 | 3/1991 |
| EP | 0 933 684 A1 | 8/1999 |
| JP | 2938397 B2 | 6/1999 |
| JP | 2002-91016 A | 3/2002 |
| JP | 2003-316021 A | 11/2003 |

OTHER PUBLICATIONS

European Search Report dated Apr. 16, 2009.
European Office Action for Application No. 08005294.07-1226, issued Apr. 29, 2010.

* cited by examiner

*Primary Examiner* — Clayton E Laballe
*Assistant Examiner* — Leon W Rhodes
(74) *Attorney, Agent, or Firm* — Sughrue Mion, PLLC

(57) ABSTRACT

A dipping-type automatic developing apparatus for a lithographic printing plate, includes a first tank containing a developer, in which a lithographic printing plate precursor having an imagewise-exposed image-recording layer is dipped and a non-image area of the imagewise-exposed image-recording layer is removed; and a second tank containing a developer, wherein the developer in the first tank and the developer in the second tank are circulated into each other to keep constant a liquid level of the developer in the first tank.

13 Claims, 4 Drawing Sheets

DIPPING-TYPE AUTOMATIC DEVELOPING APPARATUS AND METHOD FOR LITHOGRAPHIC PRINTING PLATES

BACKGROUND OF THE INVENTION

1. Field of the Invention

The present invention relates to an automatic developing apparatus for manufacturing lithographic printing plates, in particular to a dipping-type automatic developing apparatus.

2. Description of the Related Art

In general, a lithographic printing plate comprises an oleophilic image area that receives ink during a printing process and a hydrophilic non-image area that receives dampening water, Lithographic printing is a printing process of such that, based on the properties of water and printing ink repellent to each other, the oleophilic image area of a lithographic printing plate is taken as an ink-receiving area and the hydrophilic non-image area thereof as a dampening water-receiving area (ink-non-receiving area) so as to produce a difference in ink adhesiveness in the surface of the lithographic printing plate, whereby ink is adhered to only the image area and then it is transferred onto a printing object such as paper to make a print thereon.

For manufacturing the lithographic printing plate, heretofore widely employed is a lithographic printing plate precursor (PS plate) having an oleophilic photosensitive resin layer (image-recording layer) on a hydrophilic support thereof. In general, the lithographic printing plate precursor is exposed through an original image such as a lith film, then the part to be the image area of the image-recording layer is left remaining and the other unnecessary image-recording layer is dissolved and removed away with an alkaline developer or an organic solvent to thereby make the hydrophilic support surface exposed out to form a non-image area, and the plate-making process comprises the steps gives the lithographic printing plate.

The conventional plate-making process for lithographic printing plate precursors requires, after the exposure, the step of dissolving and removing the unnecessary image-recording layer with a developer or the like, which, however, is problematic in that a developer falling within a more neutral range and giving little waste is required from the viewpoint of the environment and the safety. In particular, recently, the disposal of wastes to be released through the wet treatment is a big subject of concern in the entire industrial world from the viewpoint of the global environment, and the demand for the solution of above-mentioned problem is now increasing more.

On the other hand, recently, a digital technique of electronically processing image information with computer, accumulating and outputting the data has been widely popularized, and various new image-outputting systems applicable to such a digital technique have become put into practical use. With that, a computer-to-plate technique has been specifically noted, which comprises making a high-convergence radiation such as laser light carry a digitalized image information, and scanning and exposing a lithographic printing plate precursor to the light to thereby directly produce a lithographic printing plate not via a lith film. Accordingly, it is one important technical theme to obtain a lithographic printing plate precursor applicable to the technique.

As mentioned above, it has become much more desired Man before to lower the alkaline degree of developer and to simply the processing process with it from both aspects of the consideration of the global environment and the applicability to small space and low running-cost operation. However, also as mentioned above, the development process generally comprises three steps of development with an alkaline developer having a pH of at least 10, removal of the alkali agent in a rinsing bath, and treatment with a gum liquid essentially comprising a hydrophilic resin; and an automatic developing machine itself for it also takes a large space, and development wastes, rinsing wastes and gum wastes are produced, therefore still giving some problems in point of the environment and the running cost.

As opposed to this, for example, JP-A 2002-91016 proposes a development method with an alkaline liquid containing a nonionic surfactant having a pH of from 10 to 12.5; however, the photosensitive composition contains an alkali-soluble polymer and is therefore problematic in that the development could not be attained at a pH below the range.

On the other hand, for example, Japanese Patent 2938397 describes a lithographic printing plate precursor having, as disposed on a hydrophilic support thereof, an image-forming layer that comprises hydrophobic thermoplastic polymer particles dispersed in a hydrophilic binder. The lithographic printing plate precursor may be processed by imagewise exposing it with an IR laser to thereby thermally merge the hydrophobic thermoplastic polymer particles to form an image, then fitting it onto the cylinder of a printer, and on-machine developing it with dampening water and/or ink. However, the method of image formation through such mere thermal fusion and merging of particles is problematic in that the image intensity (adhesiveness to support) is extremely low and the printing resistance is insufficient, though it exhibits good on-machine developability.

To solve the above problem, proposed is a method of manufacturing a lithographic printing plate, which comprises recording an image on a lithographic printing plate precursor having, on the support thereof, a heat-sensitive layer containing polymer particles, and then, using an automatic processing machine provided with a rubbing member, rubbing the recording surface of the lithographic printing plate precursor in the presence of a developer, with the rubbing member to thereby remove the image-recording layer in the non-exposed area (see JP-A 2003-316021).

However, the alkali level reduction and the process simplification give a great load to the developing process. For example, even though a photosensitive layer could be readily dissolved and removed with an alkaline developer, but it could not be removed with ease with a low-alkaline developer. Accordingly, the photosensitive layer that could not be dissolved but has remained may inevitably again adhere to the plate, thereby giving refuse on the plate and causing problems of bad appearance and after all printing defects. In addition, as the case may be, the remaining photosensitive layer may soil the inside area of the processing machine and the time and the labor needed for the machine maintenance may be thereby increased.

With the tendency toward the alkali level reduction and the process simplification, the processing machine to be used is being converted from a type of dipping in a developer to a type of spraying with a developer in horizontal conveyance.

However, the horizontal conveyance constitution is problematic in that the liquid often scatters and spreads, and the scattered liquid may dry up to form refuse. Naturally, in the horizontal conveyance constitution, the developer may readily dry up during the non-operation of the machine and the rubbing member (brush) and the roller may dry out and are thereby soiled, and the constitution could not evade the problem of refuse formation owing to the soiling. Accordingly, the planning of the horizontal conveyance constitution is extremely difficult, and its technical hurdle is high.

SUMMARY OF THE INVENTION

The invention has been made so as to overcome the above-mentioned drawbacks of a horizontal conveyance-type automatic developing apparatus, and its object is to provide an automatic developing apparatus and method for manufacturing lithographic printing plates capable of producing lithographic printing plates of high quality.

According to a first aspect of the invention, there is provide a dipping-type automatic developing apparatus for a lithographic printing plate, comprising: a first tank containing a developer, in which a lithographic printing plate precursor having an imagewise-exposed image-recording layer is dipped and a non-image area of the imagewise-exposed image-recording layer is removed; and a second tank containing a developer, wherein the developer in the first tank and the developer in the second tank are circulated into each other to keep constant a liquid level of the developer in the first tank.

According to a second aspect of the invention, there is provided the dipping-type automatic developing apparatus as described in the first aspect of the invention, wherein the developer in the second tank contains a surfactant in an amount of from 3 to 20% by mass and has a pH of from 4 to 9.5.

According to a third aspect of the invention, there is provided the dipping-type automatic developing apparatus as described in the second aspect of the invention, wherein the developer in the second tank contains a water-soluble resin in an amount of from 1 to 10% by mass.

According to a fourth aspect of the invention, there is provided the dipping-type automatic developing apparatus as described in the first aspect of the invention, further comprising: a lead-in roller provided upstream in a conveying direction inside the first tank, and a lead-out roller provided downstream in the conveying direction inside the first tank, wherein the first tank has a closed structure by providing a blade as kept in contact the with the lead-in roller and providing a blade as kept in contact the with the lead-out roller.

According to a fifth aspect of the invention, there is provided the dipping-type automatic developing apparatus as described in the first aspect of the invention, further comprising: a rubbing member which rotates in a state where at least a part of the rubbing member is kept dipped in the developer in the first tank to remove the non-image area.

According to a sixth aspect of the invention, there is provided the dipping-type automatic developing apparatus as described in the fifth aspect of the invention, wherein the removal of the non-image area by rotation of the rubbing member is performed at least 2 seconds after a part of the lithographic printing plate precursor to be subjected to the removal is contacted with the developer in the first tank.

According to a seventh aspect of the invention, there is provided the dipping-type automatic developing apparatus as described in the sixth aspect of the invention, wherein the rubbing member is disposed in a last half of the first tank in the conveying direction.

According to an eighth aspect of the invention, there is provided the dipping-type automatic developing apparatus as described in the fourth aspect of the invention, further comprising: a spray for spraying the developer in the second tank is disposed near downstream of the lead-in roller or the lead-out roller.

According to a ninth aspect of the invention, there is provided the dipping-type automatic developing apparatus as described in the first aspect of the invention, further comprising, in downstream of the first tank: a rinsing unit; a drying unit; and a desensitizing unit.

According to a tenth aspect of the invention, there is provided the dipping-type automatic developing apparatus as described in the first aspect of the invention, the comprising, in upstream of the first tank: at least one of a heating unit that heats the lithographic printing plate precursor and prerinsing unit that removes a protective layer if the lithographic printing plate precursor has the protective layer on a photosensitive layer.

According to an eleventh aspect of the invention, there is provided a dipping-type automatic developing method for a lithographic printing plate, comprising: dipping a lithographic printing plate precursor having an imagewise-exposed image-recording layer in a first tank containing a developer to remove a non-image area of the imagewise-exposed image-recording layer; circulating the developer in the first tank and a developer in a second tank into each other to keep constant a liquid level of the developer in the first tank; and designing the developer in the second tank to contain a surfactant in amount of from 3 to 20% by mass, have a pH of from 4 to 9.5, and further contain a water-soluble resin in an amount of from 1 to 10% by mass.

BRIEF DESCRIPTION OF THE DRAWING

FIGS. 4A and 4B explain the resources-saving characteristic of the invention, indicating that some slight improvements given to a conventional automatic developing apparatus may produce the apparatus of the invention, in which FIG. 4A is a constitutional view of the automatic developing apparatus of Embodiment 3, and FIG. 4B is a constitutional view of a conventional apparatus.

DETAILED DESCRIPTION OF THE INVENTION

Best modes for carrying out the invention are described in detail with reference to the drawings.

Embodiment 1

Figure 1:
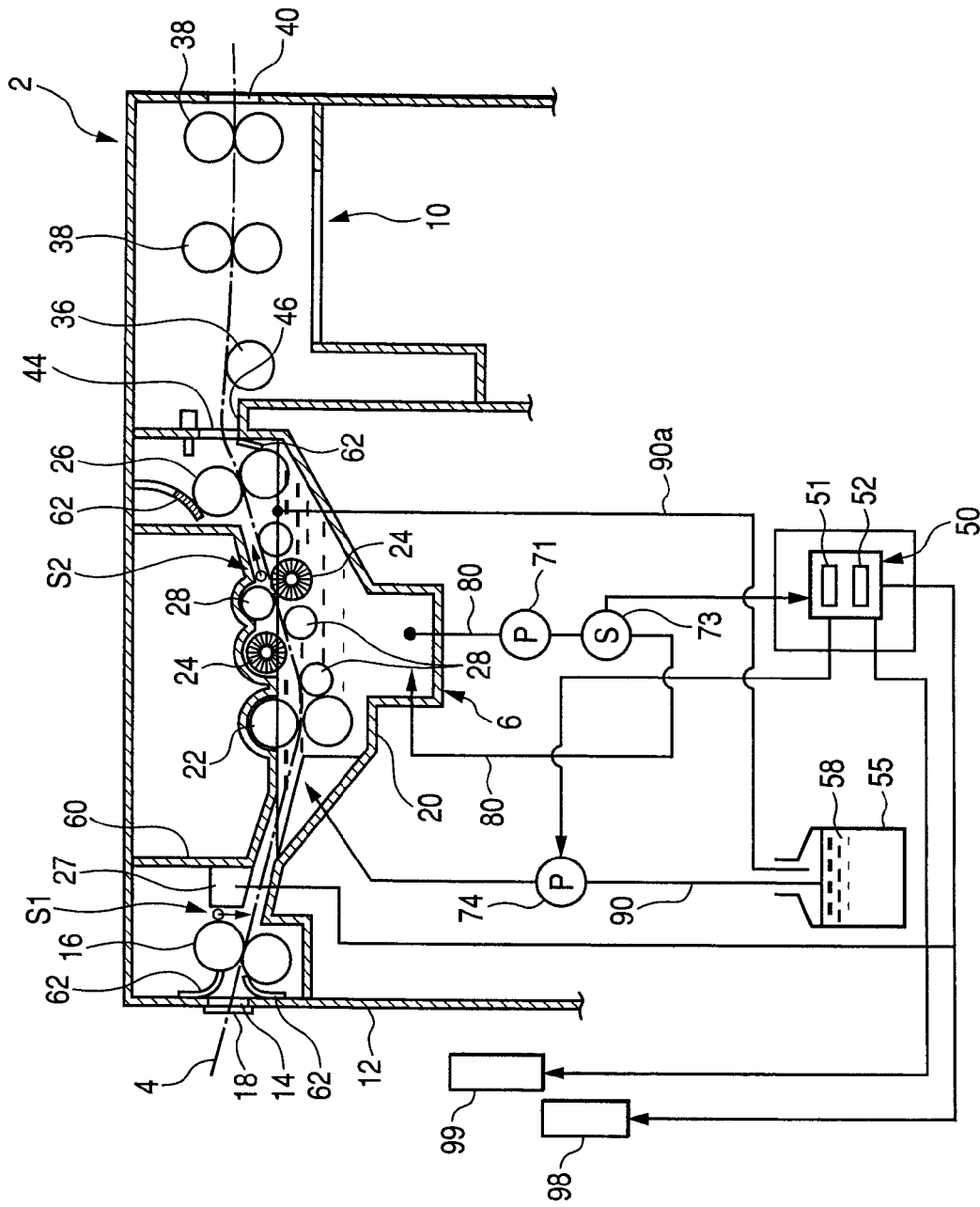
FIG. 1 is a constitutional view of an automatic developing apparatus of Embodiment 1 of the Invention.

FIG. 1 is a constitutional view of an automatic developing apparatus of Embodiment 1 of the invention.

As in FIG. 1, the automatic developing apparatus 2 comprises a development zone 6 for developing and further gumming a photosensitive lithographic printing precursor (hereinafter referred to as "PS plate") 4, and a drying zone 10 for drying the developed PS plate 4.

In the side plate 12 of the automatic developing apparatus 2, formed is an insert mouth 14; and the PS plate 4 inserted through the insert mouth 14 is conveyed into the development zone 6 by the conveyance rollers (lead-in rollers) 16. The insert mouth 14 is provided with a rubber blade 18; and when the PS plat 4 is not inserted therethrough, the insert mouth 14 is closed by the rubber blade 18.

Inside the development tank 20 in the development zone 6, disposed are conveyance rollers 22, brush rollers 24 and squeeze rollers 26 in that order from the upstream side in the machine direction; and backup rollers 28 are disposed suitably between them. The PS plate 4 is, while conveyed by the conveyance rollers 22, dipped in the developer; and by rotating the brush rollers 24, the non-image area of the PS plate 4 is removed to attain the development. This is described in detail hereinunder.

The developed PS plate 4 is then conveyed to the next drying zone 10 by the conveyance rollers lead-out rollers) 26.

In the drying zone 10, disposed are a guide roller 36 and a pair of skewer rollers 38 in that order from the upstream side in the machine direction. In the drying zone 10, disposed is a drying unit such as a hot air supply unit or a heating unit (not shown). The drying zone 10 has a take-out port 40, and the PS plate 4 dried in with the drying unit is taken out through the take-out port 40. A shutter 44 is disposed in the passage between the drying zone 10 and the development zone 6; and when the PS plate 4 does not run through the passage 46, the passage 46 is shut by the shutter 44.

The development tank 20 is provided with a box-shaped shielding cover 60 as integrated with the tank wall. The bottom wall of the shielding cover 60 is continuously arc-wise curved so as not to be in contact with the upper peripheral surfaces of the conveyance roller 20, the brush roller 24 and the backup roller 28, and not to interfere with the rollers.

Since the shielding cover 60 is box-shaped, an airtightly-closed space is formed above the development tank 20, and the amount of air inside the development zone 6 is kept as small as possible. In addition, since the shielding cover 60 is disposed, the contact area between the developer and air is kept as small as possible.

In the automatic developing apparatus 2 having the above constitution, a rubber blade 62 is disposed at its entrance port, as kept in contact with the lead-in roller 16; and thus the development zone 6 is so designed as to be substantially airtight from the external atmosphere, and the open air does not flow into it.

In addition, a rubber blade 62 is also disposed at its exit port of the development zone 6, as kept in contact with the lead-out roller 26; and thus the development zone 6 is so designed as to be substantially airtight from the external atmosphere, and the air inside the drying zone 10 does not flow into the development zone 6.

Accordingly, though some air may flow into the development zone 6 while the PS plate 4 runs through it, the zone 6 is substantially kept airtight, and has a closed constitution with little air flowing thereinto.

98 is a display device to visually show various necessary informations; and 99 is an alarm device to audibly tell them.

Next, the development zone 6 is described in detail.

To the development tank 20, connected is a first circulation line 80 for developer. The first circulation line 80 has a developer circulation pump 71, a conductivity sensor 73 and a filter (not shown), as disposed therein.

The developer circulation pump 71 acts to suck the developer in the development tank 20 out of the suction hole at the bottom of the development tank 20, into the first circulation line 80, and acts to make the developer run through the first circulation line 80 to be again jetted into the development tank 20. The filter is to filtrates the developer running through the first circulation line 80. The conductivity sensor 73 is to measure the conductivity of the developer running through the first circulation line 80.

In the development zone 6, disposed are a second circulation line 90, a developer storage tank 55 connected to the second circulation line 90, and a developer supply pump 74 disposed in the second circulation line 90; and the overflow from the development tank 20 is returned back to the developer storage tank 55 via the second circulation line 90.

This is described concretely. Near the development tank 20, disposed are a pair of second circulation lines 90, 90a for replenishing the tank with the developer 58. The second circulation line 90 for the developer 58 is connected to the external tank 55 at its one end (the lower end in FIG. 1); and in the line, disposed is the developer supply pump 74. The developer supply pump 74 meters and supplies the developer 58 from the external tank 55 into the development tank 20. Specifically, the second circulation line 90, the developer supply pump 74 and the external tank 55 constitute the developer circulation unit.

Based on the plate monitor sensor 27 and the timekeeper 52, the developer supply pump 74 is controlled by the control device (corresponding to first to fourth control units) 50 provided with control ROM and RAM with memory of developer replenishment conditions and others inputted therein (corresponding to first memory unit, second memory unit) 51 and a timekeeper 52. In other words, based on the signal from the plate monitor sensor 27 capable of detecting the presence or absence of plate conveyance and measuring the plate area of the conveyed plate, the control device 50 controls the developer supply pump 74, and attains the developer replenishment depending on the replenishment condition data stored in the developer control ROM and RAM 51 as set in accordance with the actual running conditions of the automatic development apparatus 2. Accordingly, the control unit 50 may replenish the tank with the developer 58 corresponding to the necessary amount for the replenishment condition, from the developer storage tank 55, for example, for every treatment of each one plate sheet. In this, the replenishment treatment may not be separately for each one plate sheet but may be for plural plate sheets passing trough the tank.

In the automatic developing apparatus 2, the image-recording surface of the PS plate 4 having passed through the conveyance roller pair 16 on the lead-in side, with the brush roller (rubbing member) 24 while the image-recording surface is kept dipped in the developer 58, and the non-exposed area of the image-recording layer of the PS plate 4 is thereby removed for development. In this, the plate is rubbed while kept dipped in the developer 58 filled in the development tank 20, and therefore the developer 58 scatters little. Accordingly, the contamination inside the developing machine owing to developer scattering and refuse deposition therein may be prevented. In particular, when the plate is rubbed with a rotary brush roll while dipped in the developer 58, then the rubbing member is preferably dipped in the developer 58 to a degree of at least ⅓ of the diameter thereof, more preferably at least ½, from the viewpoint of liquid scattering prevention.

As forming the development tank 20, the lithographic printing plate precursor is conveyed toward the downstream than horizontally, then dipped in the developer 58, and is thereafter conveyed in the developer 58.

The rubbing treatment with the rubbing member may be more effectively attained in case where the plate is dipped in the developer and kept therein for a predetermined period of time, and then rubbed. According to the development in this system, the developer 58 first penetrates into the photosensitive layer of a lithographic printing plate precursor, and then the photosensitive layer in the non-image area of the plate may be removed in a simplified manner. Accordingly, when the plate is dipped in the developer 58 prior to the treatment of rubbing it, then the photosensitive layer may be more effectively removed. Experiments have confirmed that the lapse of time for the dipping before rubbing may be at least 2 seconds after the part to be removed has been dipped in the liquid or has been sprayed with the liquid, more preferably at least 5 seconds, even more preferably at least 10 seconds. Since the development is attained generally within 60 seconds, the lapse of time for the development shall be inevitably shorter than 50 seconds.

In this, using a spray tube S1 or the like, the photosensitive layer of the PS plate may be contacted with the developer 58 before dipped in the developer 58. In this case, the developer to be sprayed onto the plate may be the developer in the external tank or may be a fresh developer prepared in a separate tank. Since the time to be taken for the rubbing treatment to be attained in the developer 58 after the contact of the photosensitive layer with the developer 58 may be longer, the development may be effected more effectively. The previous contact with the developer 58 may suitably shorten the time to be taken for rubbing the plate after dipped in the developer 58. In addition, a method may also be suitably employed, which comprises vibrating the PS plate 4 while contacted with the developer 58 for promoting the liquid penetration into it.

Accordingly, when the time to be taken after the PS plate 4 is dipped in the developer 58 and until it is led out of the developer 58 is represented by t sec, then the time for the rubbing treatment with the rubbing member 24 is preferably after t/2 seconds or later. Accordingly, it is desirable that the development is effected at the intermediate or in the latter part of the development tank 20. Needless-to-say, in case where the length of the development tank 20 is increased or the conveyance speed is lowered to thereby prolong the time for dipping in the developer 58, then the rubbing treatment may be effected in the former part of the development tank; however, for the purpose of attaining stable development all the time, the system is so designed that the rubbing treatment with the rubbing member 24 is attained at the intermediate or in the latter part of the development tank.

After thus developed by the use of the rubbing member 24, the PS plate 4 is led out of the developer 58. Though depending on the process condition, when the developer 58 is fatigued in this time, then refuse may readily adhere to the plate. Even in such a cases the developer 58 in the developer storage tank 55 that is less fatigued than the developer 58 used during the dipping treatment may be directly sprayed onto the PS plate 4 through the spray tube S2, whereby the impurities such as the refuse adhering to the PS plate may be removed.

The refuse removal by the spraying is extremely effective when the degree of fatigue of the developer 58 in the development tank 20 is high as mentioned hereinabove. In the circulation system for the spraying through the spray tube S2, a filter especially having a small pore size may be suitably used.

In this case, a PS plate 4 not contaminated after the processing bath alone could be obtained, and the later treatment after the processing bath may be omitted.

After the one-bath treatment in the manner as above, the drying zone 10 is provided, and the plate that has been developed and simultaneously desensitized in the first bath is then dried in the drying zone 10. In that manner, when the processing could be completed only in one bath, then the apparatus cost may be reduced and, in addition the process space may be reduced.

Moreover, since the developer 58 is circulated through the external tank, the liquid level of the developer may be all the time kept constant, and the development treatment may be thereby stabilized.

Further, in a conventional apparatus, the developer that may still have a developability potency may be partly discarded as a waste; however, in the invention, the developer is circulated, and therefore the developability potency of the developer can be used completely 100%, and the developer life may be controlled.

In addition, the liquid level can be readily controlled through overflow from the tank.

Further, since the developer contains a water-soluble resin, the constitutive members of already-existing automatic developing machines may be effectively used in the invention, and the small improvement produces a large effect.

In case where an automatic developing machine is used, for example, generally employed is any of a method of sucking up a developer 58 fed in a development tank, with a pump, and spraying it onto a plate through a spray nozzle (see JP-A 2003-316021); a method of processing a PS plate precursor 4 by leading it through a tank filled with a developer 58, as guided with a guide roll in the liquid; and a method of so-called disposable treatment where a substantially unused developer 58 is fed in an amount thereof necessary for every treatment each one plate sheet. From the viewpoint of liquid scattering prevention, preferred is the method of processing a PS plate precursor 4 while dipped and conveyed in a developer. The PS plate 4 may also be manufactured by the use of an apparatus comprising an exposing device and an automatic developing device as integrated together.

Regarding the exposing treatment in the exposing device, the PS plate precursor 4 may be exposed to light via a transparent original image screen having line images and/or dot images, or may be imagewise exposed by laser light scanning or the like with digital data. The light source suitable for the exposure includes carbon arc lamp, mercury lamp, xenon lamp, metal halide lamp, electronic flash, UV ray, IR ray, laser ray, etc. Laser ray is especially preferred, and it includes solid laser and semiconductor laser that emit IR ray having a wavelength of from 760 to 1200 nm; UV semiconductor laser that emits light having a wavelength of from 250 to 420 nm; and argon ion laser and FD-YAG laser that emit visible light. Above all, preferred is the laser that emits IR ray or UV ray and enables operation under white lamp or yellow lamp, from the viewpoint of plate processing simplification.

The rubbing member to be used in the invention may be any one capable of being used as a member for rubbing the image-recording surface of the PS plate precursor 4; and especially preferably, it is a member capable of rotating around its rotation axis as the center thereof to rub the image-recording surface (for example, known channel brush, twisted brush, planted brush, carpet brush, Moulton roller).

As the channel brush, herein usable are those manufactured by spirally winding a long channel brush (strip brush) around the surface of a roller body, as in JP-UM-A 62-167253, 4-63447, 4-64128, JP-A 6-186751.

As the twisted brush, usable are those manufactured by inserting a twisted brush into the spiral groove formed in the surface of a shaft thereby spirally winding it around the shaft, as in JP-A 3-87832.

As the planted brush, usable are those manufactured according to a method of planting a brush material in the small holes formed in a shaft roller.

As the carpet brush, usable are those manufactured by winding a long and thin strip of woven wool around the peripheral surface of a shaft roller, as in JP-A 2001-5193, 2001-66788.

As the Moulton roller, usable are those manufactured by covering a roller body with a sliding sleeve of a woven fibrous material and firmly tightening tying up the sleeve on the mounted side thereof, as in JP-A 10-198044.

In case where a rotary member is used as the rubbing member, then the number of revolution of the rubbing member is preferably as large as possible for improving the removability of the image-recording layer in the non-exposed area of the PS plate precursor 4; however, from the viewpoint of the durability and the production cost of the automatic developing apparatus, and of the scattering resistance of the developer 58 and the damage resistance of the exposed area of the PS plate precursor 4, it is preferably from 30 to 1000 rpm, more preferably from 50 to 500 rpm.

In case where a brush is used as the rubbing member, then the number of the brush may be at least one, and plural brushed may also be used. In case where 2 or more brushes are used, at least one of them may be rotated in the direction opposite to the direction of the PS plate precursor 4 in which it is processed. Further, in case where a rotary rubbing member is used, the development may be attained while the rubbing member is shaken in the rotary axis direction. By shaking the rubbing member in the rotary axis direction, the non-image area of the PS plate precursor 4 may be removed more effectively, and a PS plate 4 of better quality can be manufactured.

As the material of the brush for the rubbing member, known are natural fibers such as horsehair, pig hair, and artificial fibers, metal fibers, etc. In view of the chemical resistance thereof, preferred are artificial fibers. The artificial fibers usable herein include polyamides such as nylon 6, nylon 6.6, nylon 6.10, nylon 6.12, nylon 12; polyesters such as polyethylene terephthalate, polybutylene terephthalate (PBT); polyacryls such as polyacrylonitrile, alkyl poly(meth) acrylate; polyolefins such as polyethylene, polypropylene, polystyrene, polyvinyl chloride, polyvinylidene chloride; celluloses such as acetyl cellulose; polyurethanes such as polyurethane; and fluororesins such as polyphenylene sulfide, ethylene/tetrafluoroethylene copolymer, polyvinylidene fluoride. In consideration of the elasticity, the rigidity, the abrasion resistance, the heat resistance, the chemical resistance, the water dampenability and the moisture absorbability thereof, preferred are nylon 6, nylon 6.6, nylon 6.10, nylon 6.12, nylon 12, polypropylene, polybutylene terephthalate, polyethylene terephthalate; and more preferred are nylon 6.6, nylon 6.10, 6.12, nylon 12, polybutylene terephthalate (PBT), polypropylene. As the polyesters, especially preferred is polybutylene terephthalate (PBT). As the polyolefins, especially preferred is polypropylene.

Not specifically defined, the thickness of the hair of the brush is preferably from 0.01 mm to 1.0 mm, more preferably from 0.1 mm to 0.5 mm. When the brush is thinner than 0.1 mm, then the rubbability with it may be poor; and when it is thicker than 1.0 mm, then rubbing scratches may be formed on the surface of the plate. Also not specifically defined, the length of the hair of the brush may be generally from 3 mm to 50 mm. When it is shorter than 3 mm, then the touch of the brush to the PS plate precursor 4 may be uneven and the brush may often give rubbing scratches to the surface of the plate. Even when it is longer than 50 mm, it does not give any more advantage of developability but it is rather uneconomical. In case of the Moulton roller, since it has a sliding sleeve of a woven material, it is not defined in point of the thickness and the length of hair.

According to Embodiment 1 as above, the desensitized PS plate 4 is dried in the drying zone 10 while it is developed in the development zone, and therefore, for completing the process, the apparatus cost may be reduced and, in addition, the process space may also be reduced. Moreover, since the development and the rubbing treatment are attained in the developer in this embodiment, the liquid scattering may be evaded and therefore the refuse deposition problem owing to the drying of the scattered liquid to give refuse may be solved, when compared with the same low-alkali processing in a horizontal conveyance-type automatic developing apparatus. Moreover, since the developer 58 is circulated, the liquid level of the developer may be all the time kept constant, and the development process may be thereby stabilized.

Embodiment 2

The invention is not limited to one-bath processing. Needless-to-say, the invention may comprise steps of rinsing, drying and desensitization after the development of the PS plate 4. In this case, since the internal space of the development tank in the invention is so designed that it is shielded from the open air and since the developer is circulated, the developer is prevented from being fatigued owing to its contact with air and its meaningless waste may be evaded (in a conventional non-circulation apparatus, the developer is recovered even though not fatigued, and there is much waste of the developer against the resource-saving viewpoint).

Figure 2:
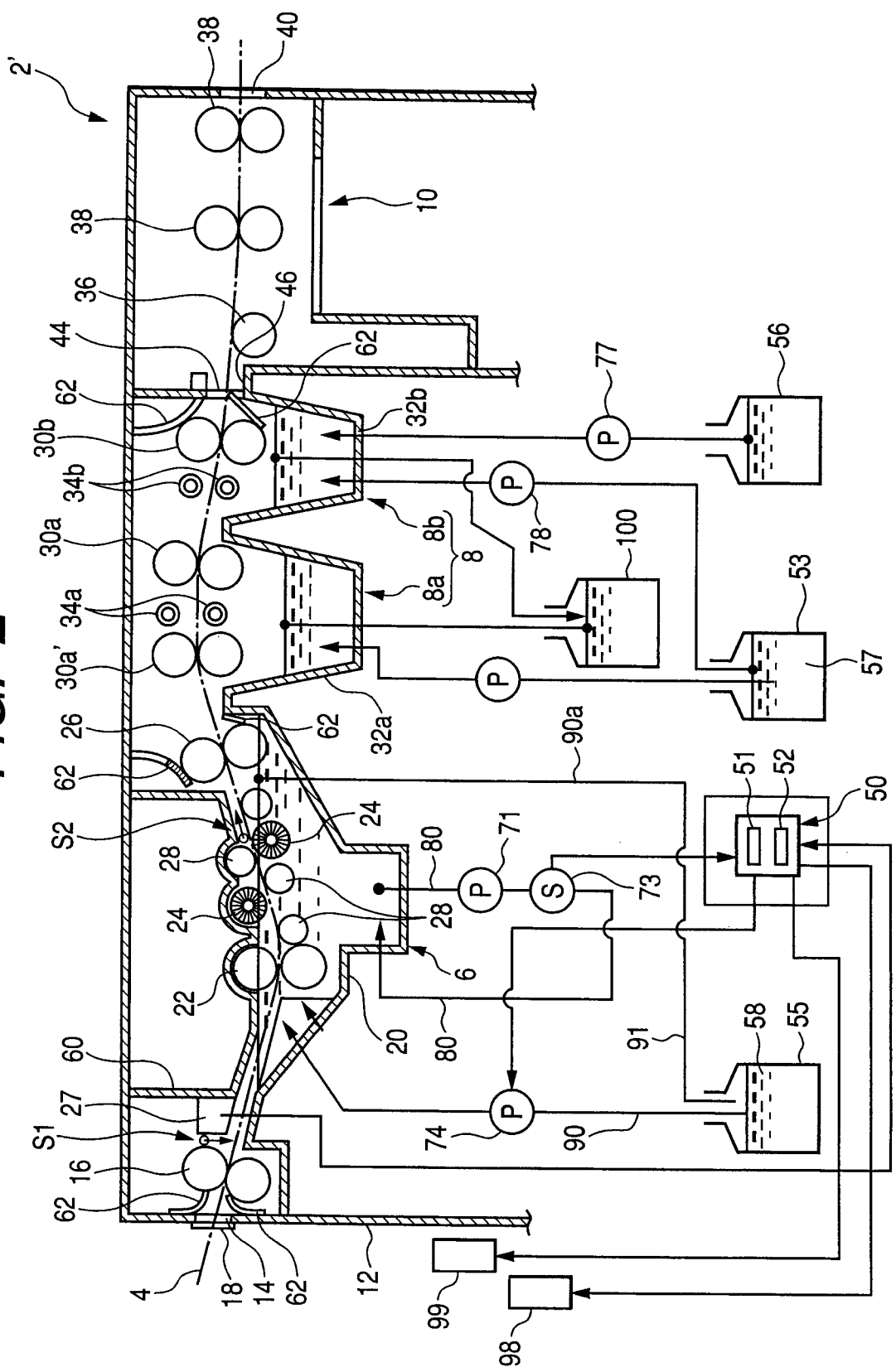
FIG. 2 is a constitutional view of an automatic developing apparatus of Embodiment 2 of the Invention.

FIG. 2 is a constitutional view of an automatic developing apparatus of Embodiment 2 of the invention.

In FIGS. 2, 2' is an automatic developing apparatus of Embodiment 2 of the invention. In the automatic developing apparatus 2', the reference numerals common to those in the automatic developing apparatus 2 (FIG. 1) of Embodiment 1 of the invention have the same functions as in the apparatus 2, and any repetitive description thereof is herein omitted.

In FIG. 2, the development zone 6 is, in principle, the same as in FIG. 1 except for a slight difference therebetween as follows: The shutter 44 disposed in the passage between the development zone 6 and the drying zone 10 in FIG. 1 is moved to the passage between the gumming zone 8 and the drying zone 10 in FIG. 2. A significant difference between them is that, in FIG. 2, a 2-stage finisher zone 8, which is to wash away the developer adhering to the developed PS plate 4 and to apply a gum liquid to the plate, is disposed downstream the development zone 6, and the drying zone 10 is disposed after it. In the development tank 6 in FIG. 1, both development and gumming are attained simultaneously, but in FIG. 2, the two treatments are separated.

In FIG. 2, the finisher zone 8 comprises a first finisher zone 8a and a second finisher zone 8b. The finisher zones 8a and 8b are provided with conveyance rollers 30a and 30b for conveying the PS plate 4, and spray members 34a and 34b for spraying the gum liquid in the finisher tanks 32a and 32b onto the PS plate 4. The developed PS plate 4 is, while conveyed by the conveyance rollers 30a and 30b, sprayed and coated with the gum liquid through the spray members 34a and 34b. The gum liquid in the finisher tank 32 b in the second finisher zone 8b existing downstream the process is supplied as an overflow into the finisher tank 32a in the first finisher zone 8a existing upstream the process; however, in place of this constitution, it may be supplied in the same manner by a pump or the like.

The shutter 44 is disposed in the passage between the drying zone 10 and the finisher zone 8, and when the PS plate 4 does not run through the passage 46, the passage 46 is shut by the shutter 44.

The second finisher tank 32b is replenished with the gum liquid from the gum liquid tank 56 by the pump 77, and is further replenished with the replenisher diluent 57 from the replenisher diluent storage tank 53 by the replenisher diluent pump 78. The replenish ratio of the gum liquid to the diluent may be, for example, 1/1. Through the replenishment, the gum waste overflowing from the first finisher tank 32a may be recovered in the waste tank 100 like the developer waste.

The automatic developing apparatus 2' having the above constitution is provided with rubber blades 62 in suitable sites, whereby the part from the development zone 6 to the second finisher zone 8b is kept substantially airtight against the external atmosphere and no open air could flow into the part. In addition, the part between the development zone 6 and the first finisher zone 8a are also kept substantially airtight by the rubber blades 62, whereby the air inside the first finisher zone 8a could not flow into the development zone 6. Accordingly, though slight air may flow into the development zone 6 while the PS plate 4 passes through it, the zone has a closed structure which is kept substantially airtight and which receives little flowing thereinto.

In that manner, according to Embodiment 2, the development and the desensitization are separated, and therefore, the fatigued liquid may be exchanged separately in each processing zone, or that is, the processing liquid may be independently effectively used. For example, the developer may be exchanged when its degree of conductivity monitored has reached the lowermost limit.

Since the developer 58 is circulated, the efficiency of the liquid is bettered, and, in addition, the liquid level of the developer can be kept all the time constant and the development treatment may be thereby stabilized. Moreover, since the development tank is so constituted as to have a closed space, the developer may be prevented from being evaporated away and its fatigue owing to air may be retarded; and therefore, a high-alkali developer (for thermal positive processing) having pH of 13 and a thermal CTP plate may be used.

In addition, since the development and the rubbing treatment are attained in the developer in this embodiment, the liquid scattering may be evaded and therefore the refuse deposition problem owing to the drying of the scattered liquid to give refuse may be solved, when compared with the process in a horizontal conveyance-type automatic developing apparatus, as in Embodiment 1.

Embodiment 3

Figure 3:
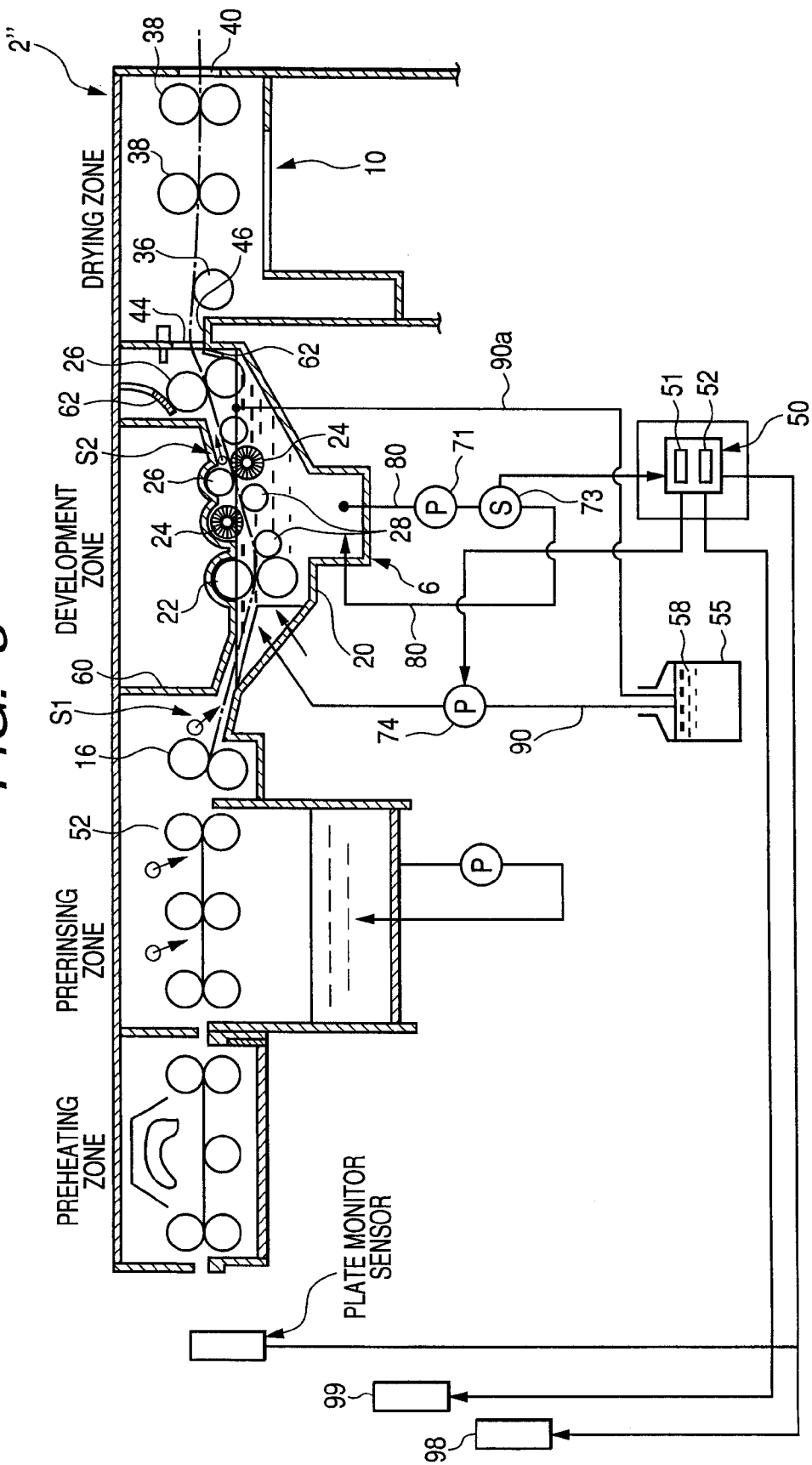
FIG. 3 is a constitutional view of an automatic developing apparatus of Embodiment 3 of the Invention.

FIG. 3 is a constitutional view of an automatic developing apparatus of Embodiment 3 of the invention.

In FIGS. 3, 2" is an automatic developing apparatus of Embodiment 3 of the invention. In the automatic developing apparatus 2", the reference numerals common to those in the automatic developing apparatus 2 (FIG. 1) of Embodiment 1 of the invention have the same functions as in the apparatus 2, and any repetitive description thereof is herein omitted.

In FIG. 3, the development zone 6 is, in principle, the same as in FIG. 1. The difference is that a preheating zone and a prerinsing zone are disposed upstream the development zone 6.

The preheating zone is disposed upstream the development zone 6 in the machine direction thereof, and this functions to maintain the surface temperature of the PS plate for a predetermined period of time while the PS plate is conveyed.

The prerinsing zone is disposed upstream the development zone 6 in the machine direction thereof and downstream the preheating zone in the machine direction thereof, and this functions to rinse and cool the surface of the PS plate with rinsing water while the PS plate is conveyed. The PS plate having passed through the rinsing zone is, after thus rinsed therein, automatically conveyed to the next step of the development zone 6.

Comprising those additional steps, the apparatus may be disadvantageous in that its size is enlarged as a whole, but may improve the quality such as the printing durability of the plate and may stabilize the quality thereof.

Both the two steps of the preheating zone and the prerinsing zone may be introduced into the apparatus, but any one of them may be introduced thereinto.

Figure 4A:
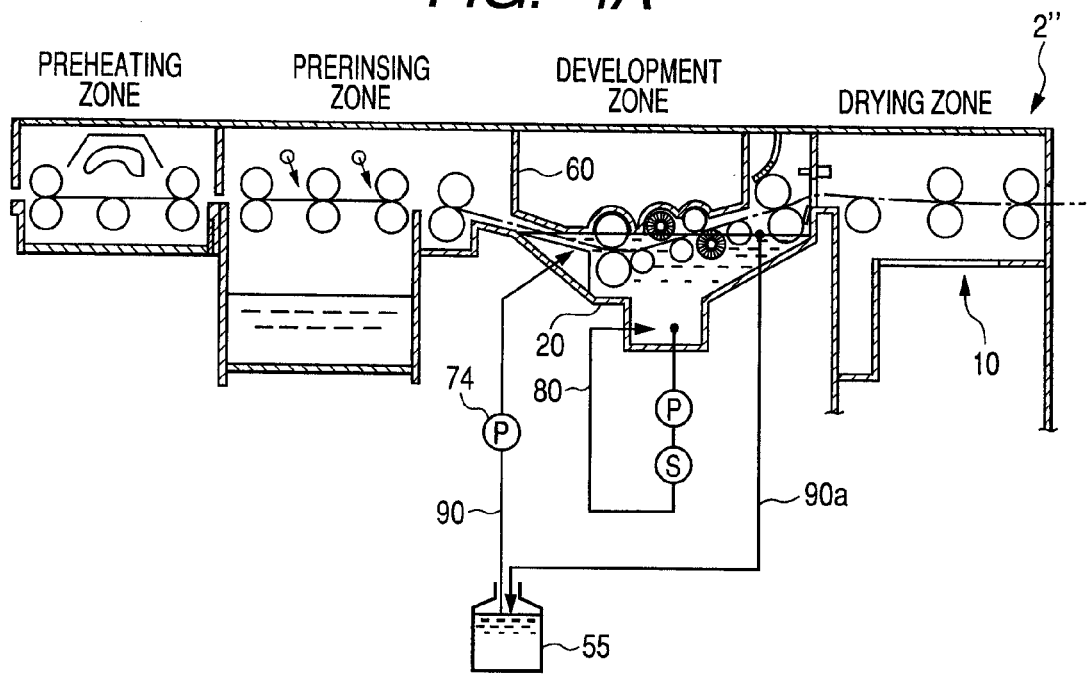
Figure 4B:
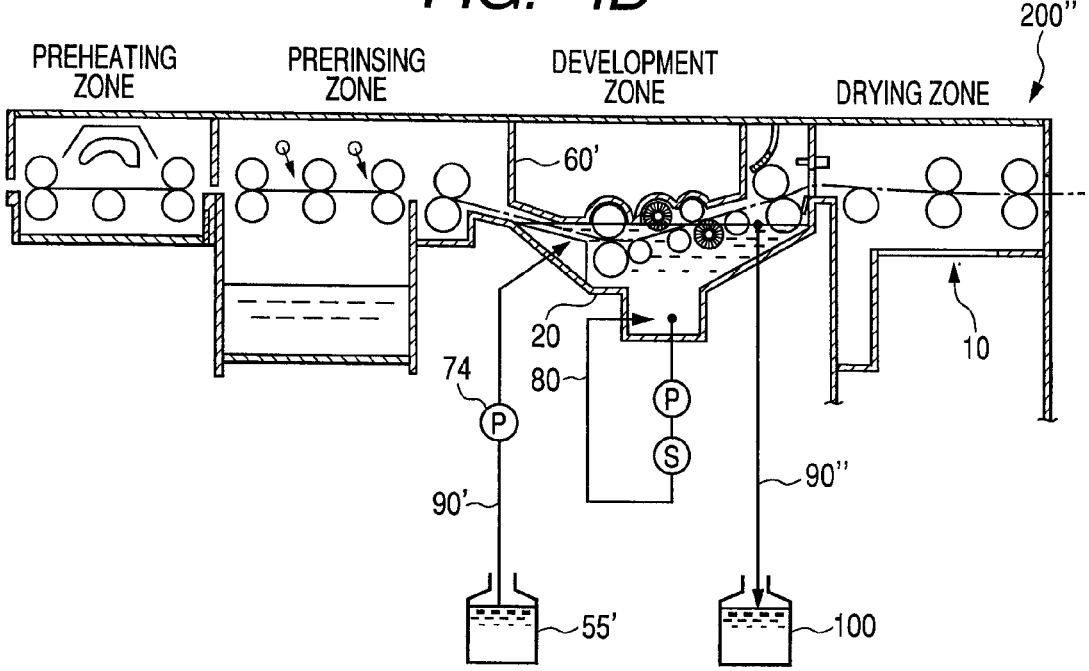

FIGS. 4A and 4B explain the resources-saving characteristic of the invention, indicating that some slight improvements given to a conventional automatic developing apparatus may produce the apparatus of the invention, in which FIG. 4A is a constitutional view of the automatic developing apparatus of Embodiment 3, and FIG. 41B is a constitutional view of a conventional apparatus.

In FIG. 4B, 200" is a conventional automatic developing apparatus, and the developing process with it comprises developing with an alkali developer in a development zone 60', after a preheating zone and a prerinsing zone, and then washing away the alkali agent in a rinsing zone, and thereafter processing with a gum liquid that comprises essentially a hydrophilic resin in a gumming zone, and drying in a drying zone.

The developer to be used in the development zone 60' is an alkaline developer having a pH of at least 10, and the alkaline developer is fed from a developer storage tank 55' to the development tank 20 via a developer supply line 90'. On the other hand, the overflowed developer is discharged out into a waste tank 100 as a used developer (waste) via a waste line 90". When the waste tank 100 is fully filled with the waste, then the waste tank 100 is taken out of the apparatus, then the waste inside it is removed, and again it is returned back into the apparatus.

When the invention that uses a developer having a pH of from 4 to 9.5 is applied to the conventional automatic developing apparatus, then the function of the invention may be imparted to the conventional automatic developing apparatus merely by slightly reforming the apparatus, and therefore, the thus-reformed apparatus may have the advantages of waste reduction, resource saving and environment protection.

FIG. 4A is the automatic developing apparatus of Embodiment 3, and its differences from FIG. 4B are the following: (1) As the second circulation line 90a, the top end of the waste line 90" in FIG. 4B is connected to the developer storage tank 55 but not to the waste tank 100.

(2) A developer having a pH of from 4 to 9.5 but not a developer having a pH of 10 or more is fed to the developer storage tank 55.

Through the above two operations, the constitutive members of an already-existing automatic developing machine may be effectively utilized and the small improvement gives a large result in the invention.

EXAMPLES

Automatic developing machine: TOPLINE OE40, by Haase (Germany),
Capacity of development tank: 92 liters.
The capacity of The external tank in the invention was 8 liters, and the overall capacity was 100 liters.
The capacity of the liquid circulation pump for the external tank and the internal development tank was 200 cc/min. As the developer, prepared was (A) an aqueous solution 1. The unit is [g]. The pH of the aqueous solution 1 was 4.3.

| | |
|---|---:|
| Water | 8970 g |
| Anionic surfactant (having the following chemical formula) | 400 g |

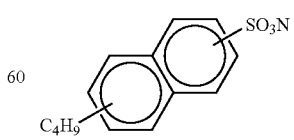

| | |
|---|---:|
| Gum arabic | 150 g |
| Enzyme-processed potato starch | 400 g |
| Sodium salt of dioctyl sulfosuccinate | 50 g |
| Ammmonium primary phosphate | 10 g |

| | |
|---|---|
| Citric acid | 10 g |
| 4-Sodium EDTA | 10 g |

Lithographic Printing Plate Precursor:
Formation of Support:

To remove the rolling oil from its surface, an aluminium plate (Material-1050) having a thickness of 0.3 mm was degreased with an aqueous 10 mas. % sodium aluminate solution at 50° C. for 30 seconds, and then the aluminium surface was grained, using three bundle-planted nylon brushes having a hair diameter of 0.3 mm and an aqueous suspension of pumices having a median radius of 25 µm (specific gravity, 1.1 g/cm$^3$), and well washed with water. The plate was etched by dipping it in an aqueous 25 mas. % sodium hydroxide solution at 45° C. for 9 seconds, then washed with water, thereafter dipped in 20 mas. % nitric acid at 60° C. for 20 seconds, and washed with water. The degree of etching of the grained surface was about 3 g/m$^2$.

Next, this was subjected to continuous electrochemical surface roughening treatment with an alternating current of 60 Hz. In this step, the electrolytic solution was an aqueous 1 mas. % nitric acid solution (containing 0.5 mas. % of aluminium ion) at 50° C. The alternating current source waveform was a trapezoidal rectangular alternating current waveform of such that the time, TP to be taken from the current level of zero to the peak is 0.8 msec, and the duty ratio is 1/1. A carbon electrode was used as the counter electrode, and the plate was subjected to electrochemical surface-roughening treatment under the condition. As an auxiliary anode, used was ferrite.

The current density was 30 A/dm$^2$ in terms of the peak current, and 5% of the current running from the source was made to run into the auxiliary anode. The quantity of electricity in nitric acid electrolysis was 175 C/dm$^2$ as the quantity of electricity when the aluminium plate serves as an anode.

Afterwards, the plate was washed with water by spraying.

Next, in the same manner as that in the nitric acid electrolysis, the plate was subjected to electrochemical surface-roughening treatment with an electrolytic solution of an aqueous 0.5 mas. % hydrochloric acid solution (containing 0.5 mas. % of aluminium ion) at 50° C. under the condition that the quantity of electricity is 50 C/dm$^2$ when the aluminum plate serves as an anode, and thereafter this was washed with water by spraying.

This plate was processed for direct-current anodic oxidation to form thereon an oxide firm of 2.5 g/m$^2$ at a current density of 15 A/dm$^2$, using an electrolytic solution of 15 mas. % sulfuric acid (containing 0.5 mas. % of aluminium ion), and then washed with water and dried.

The center line average roughness (Ra) of the substrate was measured, using a needle having a diameter of 2 µm, and was 0.51 µm.

Next, the following undercoat liquid (1) was applied to it to such a degree that the dry coating amount could be 10 mg/m$^2$, thereby producing a support to be used in the experiment mentioned below.

Undercoat Liquid (1):

| | |
|---|---|
| Undercoat Compound (1) mentioned below | 0.017 g |
| Methanol | 9.00 g |
| Water | 1.00 g |

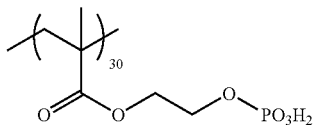

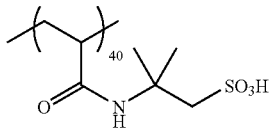

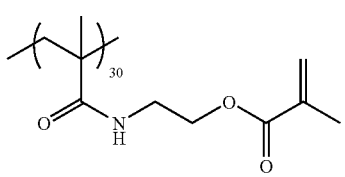

Undercoat Compound (1)

A photosensitive layer-coating liquid (1) leaving the composition mentioned below was applied to the support thus coated with the above-mentioned undercoat layer, in a mode of bar-coating, and then dried in an oven at 70° C. for 60 seconds, thereby forming an image-recording layer having a dry coating amount of 1.1 g/m$^2$. Then, a protective layer-coating liquid (1) having the composition mentioned below was applied onto the layer in a mode of bar-coating in such a manner that the dry coating amount could be 0.75 g/m$^2$, and dried at 125° C. for 70 seconds thereby obtaining a lithographic printing plate precursor.

<Photosensitive Layer-Coating Liquid (1)>

| | |
|---|---|
| Binder Polymer (1) mentioned below (weight-average molecular weight, 80,000) | 0.54 g |
| Polymerizing Compound, EO-modified isocyanurate triacrylate (Toa Gosei's Aronix M-315) | 0.40 g |
| Polymerizing Compound, ethoxylated trimethylolpropane triacrylate (Nippon Kayaku's SR9035; number of EO addition mols, 15; molecular weight, 1000) | 0.08 g |
| Sensitizing Dye (1) mentioned below | 0.06 g |
| Polymerization Initiator (2) mentioned below | 0.18 g |
| Chain Transfer (1) Agent mentioned below | 0.07 g |
| E-Phthalocyanaine Pigment Dispersion (pigment, 15 mas.pts.; dispersant binder polymer (1), 10 mas.pts.; solvent, cyclohexanone/methoxypropyl acetate/1-methoxy-2-propanol = 15 mas.pts./20 mas.pts./40 mas.pts.) | 0.40 g |
| Thermal Polymerization Inhibitor (N-nitrosophenylhydroxylamine aluminum salt) | 0.01 g |
| Water-Soluble Fluorine-Containing Surfactant (1) mentioned below | 0.001 g |
| Polyoxyethylene-Polyoxypropylene Condensate (Asahi Denka Kogyo's Pluronic L44) | 0.04 g |
| Tetramethylamine Hydrochloride | 0.01 g |
| 1-methoxy-2-propanol | 3.5 g |
| Methyl Ethyl Ketone | 8.0 g |

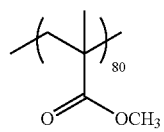

-continued

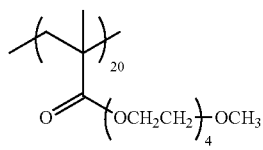

Binder Polymer (1)

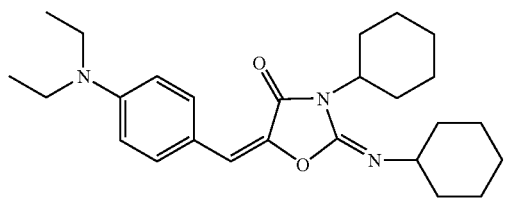

Sensitizing Dye (1)

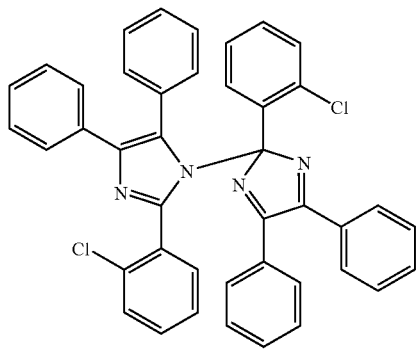

Polymerization Initiator (2)

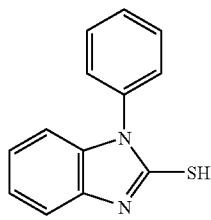

Chain Transfer Agent (1)

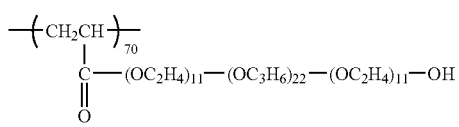

Fluorine-Containing Surfactant (1)

Protective Layer-Coating Liquid (1)

| | |
|---|---|
| Polyvinyl Alcohol (degree of saponification, 98 mol %, degree of polymerization, 500) | 40 g |
| Polyvinylpyrrolidone (weight-average molecular weight, 50,000) | 5 g |
| Poly(vinylpyrrolidone/vinyl acetate (1/1)) (weight-average molecular weight, 70,000) | 0.5 g |
| Surfactant (Emalex 710, by Nippon Emulsion) | 0.5 g |
| Water | 950 g |

Development:

A total area of 2000 m² of the sample was developed with the automatic developing apparatus shown in FIG. 4A, taking about 1 month. Not replenished. The overall amount of the developer used was 100 liters.

Comparative Example

Automatic developing machine, TOPLINE OE40 by Haase (Germany) (automatic developing apparatus shown in FIG. 4B).
Developer tank capacity, 92 liters.
Developer, high-alkali developer having pH of 12,
Formulation,

| | |
|---|---|
| Pure water | 950.0 |
| EDTA (tetradiamine tetraacetate) | 1.5 |
| Potassium carbonate | 2.2 |
| KOH (48%) | 1.5 |
| Polyethylene naphthyl ether (C = 14) | 46.0. |

Lithographic Printing Plate Precursor: FUJIFILM's CTP plate, LP-NNV (photopolymerizing CTP lithographic printing plate).
Development:

A total area of 2000 m² of the sample was developed with OE40, taking about 1 month. For maintaining the developability thereof, the machine was replenished with the above developer. The overall amount of the developer used reached 258 liters.

Example of Description of Non-Alkali Aqueous Solution

The lithographic printing plate precursor in the invention is imagewise exposed with a light source of from 350 nm to 450 nm, and its surface is rubbed with a rubbing member in an aqueous solution having a pH of from 2 to 10, whereby the protective layer and the photosensitive layer in the non-exposed area may be removed, and an image may be formed on the surface of the aluminium plate support.

The aqueous solution to be used in the invention is an aqueous solution having a pH of from 2 to 10. For example, it is preferably water alone or an aqueous solution comprising water as the main ingredient thereof (containing at least 60 mas. % of water). Especially preferred is an aqueous solution having the same composition as that of ordinary dampening water, or an aqueous solution containing a surfactant (anionic, nonionic or cationic), or an aqueous solution containing a water-soluble polymer compound. In particular, more preferred is an aqueous solution containing both a surfactant and a water-soluble polymer compound. The pH of the aqueous solution is more preferably from 3 to 9, even more preferably from 4 to 8.

The anionic surfactant usable in the invention includes fatty acid salts, abietic acid salts, hydroxyalkanesulfonic acid salts, alkanesulfonic acid salts, dialkylsulfosuccinic acid salts, linear alkylbenzenesulfonic acid salts, branched alkylbenzenesulfonic acid salts, alkylnaphthalenesulfonic acid salts, alkylphenoxypolyoxyethylene-propylsulfonic acid salts, polyoxyethylene-alkylsulfophenyl ether salts, N-methyl-N-oleyltaurine sodium salts, N-alkylsulfosuccinic acid monoamide disodium salts, petroleum sulfonic acid salts, sulfated castor oil, sulfated beef tallow oil, sulfate ester salts of fatty acid alkyl esters, alkyl sulfate ester salts, polyoxyethylene-alkyl ether ester salts, fatty acid monoglyceride sulfate water salts, polyoxyethylene alkylphenyl ether sulfate ester salts, polyoxyethylene styrylphenyl ether sulfate ester salts, alkylphosphate ester salts, polyoxyethylene alkylether phosphate ester salts, polyoxyethylene alkylphenyl ether phosphate ester salts, partially-saponified products of styrene-maleic anhydride copolymers, partially-saponified products of olefin-maleic anhydride copolymers, naphthalenesulfonic acid salt-formalin condensates. Of those, preferred are dialkylsulfosuccinic acid salts, alkylsulfate ester salts and alkylnaphthalenesulfonic acid salts.

Not specifically defined, the cationic surfactant usable in the invention may be any known one. For example, it includes alkylamine salts, quaternary ammonium salts, polyoxyethylene-alkylamine salts, polyethylene-polyamine derivatives.

The nonionic surfactant usable in the invention includes polyethylene glycol-type higher alcohol ethyleneoxide adducts, alkylphenol ethyleneoxide adducts, fatty acid ethyleneoxide adducts, polyalcohol fatty acid ester ethylencoxide adducts, higher alkylamine ethyleneoxide adducts, fatty acid amide ethyleneoxide adducts, fat/oil ethyleneoxide adducts, polypropylene glycol ethyleneoxide adducts, dimethylsiloxane-ethyleneoxide block copolymers, dimethylsiloxane-(propyleneoxide-ethyleneoxide) block copolymers; and polyalcohol-type glycerol fatty acid esters, pentaerythritol fatty acid esters, sorbitol/sorbitan fatty acid esters, sucrose fatty acid esters, polyalcohol alkyl ethers, alkanolamine fatty acid amides.

One or more of these nonionic surfactants may be used herein either singly or as combined. In the invention, more preferred are sorbitol and/or sorbitan fatty acid ester ethylene oxide adducts, polypropylene glycol ethyleneoxide adducts, dimethylsiloxane-ethyleneoxide block copolymers, dimethylsiloxane-(propyleneoxide-ethyleneoxide) block copolymers, polyalcohol fatty acid esters.

From the viewpoint of its stable solubility in and miscibility with water, the nonionic surfactant for use in the aqueous solution in the invention preferably has HLB (hydrophile-lipophile balance) of at least 6, more preferably at least 8. Further, the ratio of the nonionic surfactant in the aqueous solution is preferably from 0.01 to 10% by weight, more preferably from 0.01 to 5% by weight. In addition, acetylene glycol or acetylene alcohol oxyethylene adducts, fluorine-containing surfactants and silicon-containing surfactants are also usable herein.

The aqueous solution in the invention may contain an organic solvent. The organic solvent that may be in the solution includes, for example, aliphatic hydrocarbons (e.g., hexane, heptane, "Isoper E, H, G" (by Esso Chemical), gasoline, kerosene), aromatic hydrocarbons (e.g., toluene, xylene), halogenohydrocarbons (e.g., methylene dichloride, ethylene dichloride, trichlene, monochlorobenzene); and polar solvents such as alcohols, esters.

In case where the organic solvent is insoluble in water, it may be solubilized in water with surfactant or the like before it is used in the invention; and in case where the aqueous solution contains an organic solvent, the concentration of the solvent is preferably less than 40% by weight from the viewpoint of the safety and the inflammability thereof.

The aqueous solution in the invention may also contain a water-soluble polymer compound. The water-soluble polymer compound includes soybean polysaccharides, modified starch, gum arabic, dextrin, cellulose derivatives (e.g., carboxymethyl cellulose, carboxyethyl cellulose, methyl cellulose) and their modified derivatives, pullulane, polyvinyl alcohol and its derivatives, polyvinylpyrrolidone, polyacrylamide and acrylamide copolymer, vinyl methyl ether/maleic anhydride copolymer, vinyl acetate/maleic anhydride copolymer, styrene/maleic anhydride copolymer.

The soybean polysaccharides for use herein may be any known ones, including, for example, commercial products of Soyafive (by Fuji Oil) of various grades. Preferred for use herein are those of which the viscosity of the aqueous 10 mas. % solution falls within a range of from 10 to 100 mPa/sec.

The modified starch for use herein may be also any known one, which may be produced according to a method comprising decomposing corn, potato, tapioca, rice or wheat-derived starch with acid or enzyme so as to have from 5 to 30 glucose residues in one molecule and further adding oxypropylene thereto in alkali.

Two or more such water-soluble polymer compounds may be used as combined. The content of the water-soluble polymer compound in the aqueous solution is preferably from 0.1 to 20% by mass, more preferably from 0.5 to 10% by mass.

In addition to the above, the aqueous solution in the invention may further contain a preservative, a chelate compound, a defoaming agent, an organic acid, an inorganic acid, an inorganic salt.

For the preservative, preferred are phenol and its derivatives, formalin, imidazole derivatives, sodium dehydroacetate, 4-isothiazolin-3-one derivatives, benzisothiazolin-3-one, benzotriazole derivatives, amidine-guanidine derivatives, quaternary ammonium salts, pyridine, quinoline and guanidine derivatives, diazine, triazole derivatives, oxazole, oxazine derivatives, nitrobromoalcohol-type 2-bromo-2-nitropropane-1,3-diol, 1,1-dibromo-1-nitro-2-ethanol, 1,1-dibromo-1-nitro-2-propanol.

The chelate compound includes organic phosphonic acids and phosphonoalkane-tricarboxylic acids, for example, ethylenediaminetetraacetic acid and its potassium salt, sodium salt; diethylenetriamine-pentaacetic acid and its potassium salt, sodium salt; triethylenetetramine-hexaacetic acid and its potassium salt, sodium salt; hydroxyethylethylenediamine-triacetic acid and its potassium salt, sodium salt; nitrilotriacetic acid and its sodium salt; 1-hydroxyethane-1,1-diphosphonic acid, and its potassium salt, sodium salt; aminotri (methylenephosphonic acid), and its potassium salt, sodium salt. In place of sodium salt and potassium salts of the above-mentioned chelate agents, also effective are organic amine salts thereof.

As the defoaming agent, usable are ordinary silicone-type self-emulsifiable or emulsifiable, or nonionic surfactant-type compounds having HLB of at most 5. Preferred are silicone-type defoaming agents. Of those, usable are any of emulsifying and dispersing compounds or solubilizing compounds.

The organic acid includes citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid, organic phosphonic acids. The organic acid for use herein may also be in the form of its alkali metal salt or ammonium salt.

The inorganic acid and the inorganic salt include phosphoric acid, metaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexametaphosphate, magnesium sulfate, sodium nitrate, potassium nitrate, ammonium nitrate, sodium sulfate, potassium sulfate, ammonium sulfate, sodium sulfite, ammonium sulfite, sodium hydrogensulfate, nickel sulfate.

[Lithographic Printing Plate Precursor]

First described is the lithographic printing plate precursor for use in the invention.

<Photosensitive Layer>

The lithographic printing plate precursor for use in the plate-making process of the invention has a negative photosensitive layer of which the exposed area is curable, Not specifically defined, the negative photosensitive layer is a radical-polymerizing photosensitive layer that contains a hydrophobic binder polymer, a polymerization initiator and a polymerizing compound, as having good developability and good printing resistance. The constitutive ingredients of the photosensitive layer are described below.

(Hydrophobic Binder Polymer)

The hydrophobic binder polymer usable in the photosensitive layer in the invention is preferably a water-insoluble polymer. Further, it is desirable that the hydrophobic binder polymer usable in the invention does not substantially contain an acid group such as a carboxyl group, a sulfone group or a phosphoric acid group; and the acid value of the binder polymer (the acid content per gram of the polymer, as represented by the chemical equivalent number thereof) is preferably at most 0.3 meq/g, more preferably at most 0.1 meq/g.

Specifically, the hydrophobic binder polymer usable in the invention is preferably insoluble in water and in an aqueous solution having a pH of 10 or more; and the solubility of the hydrophobic binder polymer in water or in an aqueous solution having a pH of 10 or more is preferably at most 0.5% by mass, more preferably at most 0.1% by mass. Using the hydrophobic binder polymer of the type improves the film strength, the water resistance and the ink accessibility of the photosensitive layer, therefore improving the printing resistance thereof.

Not detracting from the capability of the lithographic printing plate in the invention, the hydrophobic binder polymer may be any known one with no specific limitation, so far as it falls within the above-mentioned range. Preferably, it is a film-forming, linear organic polymer.

Examples of the hydrophobic binder polymer of the type are preferably polymers selected from acrylic resins, polyvinyl acetal resins, polyurethane resins, polyamide resins, epoxy resins, methacrylic resins, styrene resins, polyester resins. Above all, more preferred are acrylic resins; and even more preferred are (meth)acrylate copolymers. More concretely, especially preferred are copolymers of an alkyl or aralkyl (meth)acrylate and a (meth)acrylate in which R of the ester residue (—COOR) contains an unit of —CH$_2$CH$_2$O— or an unit of —CH$_2$CH$_2$NH—. The alkyl group in the alkyl (meth)acrylate is preferably an alkyl group having from 1 to 5 carbon atoms, more preferably a methyl group. The aralkyl (meth)acrylate is preferably benzyl (meth)acrylate.

Further, the hydrophobic binder polymer may be crosslinkable for improving the film strength of the image area.

For making the binder polymer crosslinkable, a crosslinking functional group such as an ethylenic unsaturated bond may be introduced into the main chain or the side branch of the polymer. The crosslinking functional group may be introduced through copolymerization, or may be introduced through polymer reaction.

The crosslinking group is a group capable of crosslinking the polymer binder in the process of radical polymerization reaction that occurs in the photosensitive layer when the lithographic printing plate precursor is exposed to light. So far as it has the function, the group is not specifically defined. For example, the group may be an addition-polymerizable functional group, such as an ethylenic unsaturated bond, an amino group, an epoxy group. It may also be a functional group capable of giving a radical through photoirradiation, and the crosslinking group of the type includes, for example, a thiol group, a halogen group, an onium salt structure. Above all, preferred is an ethylenic unsaturated bond group; and more preferred are functional groups of the following general formulae (1) to (3):

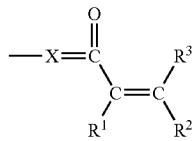

General Formula (1)

In the above formula (1), $R^1$ to $R^3$ each independently represent a monovalent organic group; and $R^1$ is preferably a hydrogen atom or an alkyl group optionally having a substituent, more preferably a hydrogen atom or a methyl group as its radical reactivity is high. Also preferably, $R^2$ and $R^3$ each independently represent a hydrogen atom, a halogen atom, an amino group, a carboxyl group, an alkoxycarbonyl group, a sulfo group, a nitro group, a cyano group, an alkyl group optionally having a substituent, an aryl group optionally having a substituent, an alkoxy group optionally having a substituent, an aryloxy group optionally having a substituent, an alkylamino group optionally having a substituent, an arylamino group optionally having a substituent, an alkylsulfonyl group optionally having a substituent or an arylsulfonyl group optionally having a substituent; more preferably a hydrogen atom, a carboxyl group, an alkoxycarbonyl group, an alkyl group optionally having a substituent or an aryl group optionally having a substituent as the radical reactivity thereof is high.

X represents an oxygen atom, a sulfur atom, or $N(R^{12})$—; $R^{12}$ represents a hydrogen atom, or a monovalent organic group. $R^{12}$ includes an alkyl group optionally having a substituent, and is preferably a hydrogen atom, a methyl group, an ethyl group or an isopropyl group as its radical reactivity is high.

The introducible substituent includes an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amido group, an alkylsulfonyl group, an arylsulfonyl group.

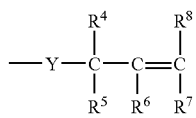

General Formula (2)

In the above formula (2), $R^4$ to $R^8$ each independently represent a monovalent organic group. Preferably, $R^4$ to $R^8$ includes a hydrogen atom, a halogen atom, an amino group, a dialkylamino group, a carboxyl group, an alkoxycarbonyl group, a sulfo group, a nitro group, a cyano group, an alkyl group optionally having a substituent, an aryl group optionally having a substituent, an alkoxy group optionally having a substituent, an aryloxy group optionally having a substituent, an alkylamino group optionally having a substituent, an arylamino group optionally having a substituent, an alkylsulfonyl group optionally having a substituent, an arylsulfonyl group optionally having a substituent; more preferably a hydrogen atom, a carboxyl group, an alkoxycarbonyl group, an alkyl group optionally having a substituent, an aryl group optionally having a substituent.

As the introducible substituent, the same as those in formula (1) are exemplified. Y represents an oxygen atom, a sulfur atom, or N($R^{12}$)—. $R^{12}$ has the same meaning as that of $R^{12}$ in formula (1), and its preferred examples are also the same as therein.

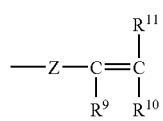

General Formula (3)

In the above formula (3), $R^9$ is preferably a hydrogen atom or an alkyl group optionally having a substituent, more preferably a hydrogen atom or a methyl group as its radical reactivity is high. $R^{10}$ and $R^{11}$ each independently represent a hydrogen atom, a halogen atom, an amino group, a dialkylamino group, a carboxyl group, an alkoxycarbonyl group, a sulfo group, a nitro group, a cyano group, an alkyl group optionally having a substituent, an aryl group optionally having a substituent, an alkoxy group optionally having a substituent, an aryloxy group optionally having a substituent, an alkylamino group optionally having a substituent, an arylamino group optionally having a substituent, an alkylsulfonyl group optionally having a substituent, or an arylsulfonyl group optionally having a substituent; more preferably a hydrogen atom, a carboxyl group, an alkoxycarbonyl group, an alkyl group optionally having a substituent, or an aryl group optionally having a substituent, as the radical reactivity thereof is high.

As the introducible substituent, the same as those in formula (1) are exemplified. Z represents an oxygen atom, a sulfur atom, —N($R^{13}$)—, or a phenylene group optionally having a substituent. $R^{13}$ represents an alkyl group optionally having a substituent, preferably a methyl group, an ethyl group or an isopropyl group as its radical reactivity is high.

Of those mentioned above, more preferred are (meth)acrylic acid copolymers and polyurethanes having a crosslinking group in the side branch thereof.

For example, the crosslinking hydrophobic binder polymer cures as follows: A free radical (a polymerization-initiating radical, or a growing radical in the polymerization step of a polymerizing compound) is added to the crosslinking functional group of the polymer to induce addition polymerization directly between the polymer or via the polymerization chain of the polymerizing compound, thereby forming a crosslink between the polymer molecules to cure the polymer. Apart from this, an atom in the polymer (for example, a hydrogen atom on the carbon atom adjacent to the functional crosslinking group) is pulled out by a free radical to form a polymer radical, and they bond to each other to form a crosslink between the polymer molecules to cure the polymer.

The content of the crosslinking group in the hydrophobic binder polymer (the content of the polymerizable unsaturated double bond through iodine titration) is preferably from 0.1 to 10.0 mmol per gram of the hydrophobic binder polymer, more preferably from 1.0 to 7.0 mmol, most preferably from 2.0 to 5.5 mmol.

From the viewpoint of improving the developability in aqueous solution, the binder polymer is preferably hydrophilic; and from the viewpoint of improving the printing resistance, it is important that the binder polymer is compatible with the polymerizing compound in the photosensitive layer, or that is, the polymer is preferably oleophilic. From that standpoint, in the invention, it may be effective to copolymerize a hydrophilic group and an oleophilic group in the hydrophobic binder polymer for improving the developability and the printing resistance. Preferably, for example, the hydrophilic group includes those having a hydrophilic group, such as a hydroxyl group, a carboxylate group, a hydroxyethyl group, an ethyleneoxy group, a hydroxypropyl group, a polyoxyethyl group, a polyoxypropyl group, an amino group, an aminoethyl group, an aminopropyl group, an ammonium group, an amido group, a carboxymethyl group.

Preferably, the hydrophobic binder polymer has a weight-average molecular weight of at least 5000, more preferably from 10,000 to 300,000, and has a number-average molecular weight of at least 1000, more preferably from 2000 to 250,000. Also preferably, the degree of polydispersiveness (weight-average molecular weight/number-average molecular weight) of the polymer is from 1.1 to 10.

The hydrophobic binder polymer may be any of a random polymer, a block polymer, a graft polymer, but is preferably a random polymer.

One or more different types of hydrophobic binder polymers may be used herein either singly or as combined.

The content of the hydrophobic binder polymer may be from 5 to 90% by mass relative to the overall solid content of the photosensitive layer, preferably from 10 to 70% by mass, more preferably from 10 to 60% by mass. Within the range, the image area of the plate may have good strength, and the plate may have good image formability.

(Polymerization Initiator)

The polymerization initiator for use in the invention is a compound capable of generating a radical by light or heat energy, thereby initiating and promoting the polymerization of a compound having a polymerizing unsaturated group. The radical initiator of the type may be suitably selected from known polymerization initiators and compounds with a bond having a low bonding dissociation energy.

The radical-generating compound includes, for example, organic halogen compounds, carbonyl compounds, organic peroxides, azo-type polymerization initiators, azide compounds, metallocene compounds, hexaarylbiimidazole compounds, organic boron compounds, disulfone compounds, oxime ester compounds, onium salt compounds.

The organic halogen compounds are concretely those described in Wakabayashi et al's Bull, Chem. Soc. Japan, 42, 2924 (1969); U.S. Pat. No. 3,905,815, JP-B 46-4605, JP-A 48-36281, 53-133428, 55-32070, 60-239736, 61-169835, 61-169837, 62-58241, 62-212401, 63-70243, 63-298339; M. P. Hutt, Journal of Heterocyclic Chemistry, 1 (No. 3) (1970). Especially preferred are trihalomethyl group-substituted oxazole compounds and S-triazine compounds.

The carbonyl compounds include benzophenone, Michler's ketone, 2-methylbenzophenone, 3-methylbenzophenone, 4-methylbenzophenone, 2-chlorobenzophenone, 4-bromobenzophenone.

For the azo compounds, herein usable are, for example, the azo compounds described in JP-A 8-108621.

The metallocene compounds include various titanocene compounds described in JP-A 59-152396, 61-151197, 63-41484, 2-249, 2-4705, 5-83588; and iron-arene complexes described in SP-A 1-152109.

The hexaarylbiimidazole compounds include, for example, various compounds described in JP-B 6-29285, U.S. Pat. Nos. 3,479,185, 4,311,783, 4,622,286.

The organic boron compounds include, for example, organic borates described in JP-A 2002-116539, and Kunz, Martin, Rad. Tech., '98, Proceeding Apr., 19-22, 1998, Chicago; organic boron sulfonium complexes or organic boron oxosulfonium complexes described in JP-A 6-157623, 6-175564, 6-175561; organic boron iodonium complexes described in JP-A 6-175554, 6-175553; organic boron phosphonium complexes described in JP-A 9-188710; organic boron transition metal coordination complexes described in JP-A 6-348011, 7-128785, 7-140589, 7-306527, 7-292014.

The disulfone compounds include those described in JP-A 61-166544, 2003-328465.

The oxime ester compounds include those described in J.C.S. Perkin II (1979) 1653-1660, J.C.S. Perkin II (1979) 156-162, Journal of Photopolymer Science and Technology (1995) 202-232, JP-A 2000-66385; and those described in JP-A 2000-80068.

The onium salt compounds include, for example, onium salts such as diazonium salts described in S. I. Schlesinger, Photogr. Sci. Eng., 18, 387 (1974), T. S. Bal et al., Polymer, 21, 423 (1980); ammonium salts described in U.S. Pat. No. 4,069,055, JP-A 4-365049; phosphonium salts described in U.S. Pat. Nos. 4,069,055, 4,069,056; iodonium salts described in EP 104,143, U.S. Pat. No. 339,049, U.S. Pat. No. 410,201, JP-A 2-150848, 2-296514; sulfonium salts described in EP 370,693, 390, 214, 233, 567, 297, 443, 297, 442, U.S. Pat. Nos. 4,933,377, 161,811, 410,201, 339,049, 4,760,013, 4,734,444, 2,833,827, GP 2,904,626, 3,604,580, 3,604,581; selenonium salts described in J. V. Crivello et al., Macromolecules, 10(6), 1307 (1997), J. V. Crivello et al., J. Polymer Sci., Polymer Chem. Ed., 17, 1047 (1979); and arsonium salts described in C. S. Wen et al., Teh. Proc. Conf. Rad. Curing ASIA, p. 478, Tokyo, Oct. (1988).

In the invention, these onium salts functions not as an acid generator but as an ionic radical polymerization initiator, Onium salts of the following general formulae (RI-I) to (RI-III) are preferably used in the invention,

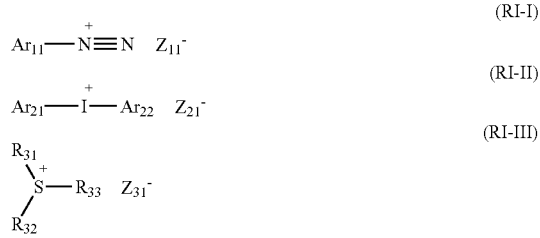

In formula (RI-I), $Ar_{11}$ represents an aryl group having at most 20 carbon atoms and optionally having from 1 to 6 substituents; and from the viewpoint of the stability thereof, it is preferably a perchlorate ion, a hexafluorophosphate ion, a tetrafluoroborate ion, a sulfonate ion or a sulfinate ion.

In formula (RI-II), $Ar_{21}$ and $Ar_{22}$ each independently represent an aryl group having at most 20 carbon atoms and optionally having from 1 to 6 substituents; and the preferred substituents are an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamide or arylamide group having from 1 to 12 carbon atoms, a carbonyl group, a carboxyl group, a cyano group, a sulfonyl group, a thioalkyl group having from 1 to 12 carbon atoms, a thioaryl group having from 1 to 12 carbon atoms. $Z_{21}^-$ represents a monovalent anion. Concretely, it is preferably a perchlorate ion, a hexafluorophosphate ion, a tetrafluoroborate ion, a sulfonate ion, a sulfinate ion or a carboxylate ion, from the viewpoint of the stability and the reactivity thereof.

In formula (RI-II), $R_{31}$, $R_{32}$ and $R_{33}$ each independently represent an aryl, alkyl, alkenyl or alkynyl group having at most 20 carbon atoms and optionally having from 1 to 6 substituents, and especially preferably an aryl group from the viewpoint of the reactivity and the stability thereof. $Z_{31}^-$ represents a monovalent anion. Concretely, it is preferably a perchlorate ion, a hexafluorophosphate ion, a tetrafluoroborate ion, a sulfonate ion, a sulfinate ion or a carboxylate ion, from the viewpoint of the stability and the reactivity thereof. More preferably, it is a carboxylate ion as in JP-A 2001-343742, even more preferably a carboxylate ion as in JP-A 2002-148790.

Not specifically defined, the polymerization initiator is more preferably any of triazine-type initiators, organic halogen compounds, oxime ester compounds, diazonium salts, iodonium salts and sulfonium salts, from the viewpoint of the reactivity and the stability thereof.

One or more types of those polymerization initiators may be used either singly or as combined.

The polymerization initiator may be added to one and the same layer along with any other ingredient thereto; or may be added to a separate layer additionally provided in the plate. The polymerization initiator may be added in an amount of preferably from 0.1 to 50% by mass relative to the overall solid content of the photosensitive layer, more preferably from 0.5 to 30% by mass, even more preferably from 0.8 to 20% by mass.

(IR Absorbent)

An IR absorbent may be used in the photosensitive layer of the lithographic printing plate precursor that is subjected to imagewise exposure with an IR-emitting light source, as combined with the above-mentioned polymerization initiator. In general, an IR absorbent has a function of converting IR rays which it has absorbed into heat, and the resulting heat thermally decomposes the polymerization initiator to generate a radical. The IR absorbent for use in the invention is a dye or pigment having an absorption maximum within a wavelength range of from 760 to 1200 nm.

The dye usable herein is any known one including commercial dyes and dyes described in literature, for example, Dye Handbook (edited by the Association of Organic Synthetic Chemistry of Japan, 1970). Concretely, they include azo dyes, metal complex azo dyes, pyrazolonazo dyes, naphthoquinone dyes, anthraquinone dyes, phthalocyanine dyes, carbonium dyes, quinonimine dyes, methine dyes, cyanine dyes, squarylium dyes, pyrylium salts, metal thiolate complexes.

Of those dyes, especially preferred are cyanine dyes, squarylium dyes, pyrylium salts, nickel thiolate complexes, indolenine-cyanine dyes.

The pigment usable in the invention include commercial pigments and pigments described in Color Index (C.I.) Handbook, Newest Pigment Handbook (edited by the Pigment Technology Association of Japan, 1977), Newest Pigment Application Technology (by CMC, 1986), Printing Ink Technology (by CMC, 1984).

Regarding their type, herein usable are black pigments, yellow pigments, orange pigments, brown pigments, red pigments, violet pigments, blue pigments, green pigment, fluorescent pigments, metal powder pigments, polymer bound pigments. Concretely, they include insoluble azo pigments, azo-lake pigments, condensed azo pigments, chelate-azo pigments, phthalocyanine pigments, anthraquinone pigments, perylene and perinone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, carbon black. Of those pigments, preferred is carbon black.

Preferably, the particle size of the pigment falls within a range of from 0.01 to 10 µm, more preferably from 0.05 to 1 µm, even more preferably from 0.1 to 1 µm. Within the range, the pigment dispersion may be stable in a coating liquid for photosensitive layer and may give a uniform photosensitive layer.

It is desirable that the amount of the IR absorbent to be added to the photosensitive layer is a necessary least amount thereof for the purpose of preventing its side effect to inhibit polymerization.

The IR absorbent may be added to the photosensitive layer in an amount of from 0.001 to 50% by mass relative to the solid content of the layer, preferably from 0.005 to 30% by mass, more preferably from 0.01 to 10% by mass. Within the range, the additive may has a high sensitivity not having any negative influences on the uniformity and the film strength of the photosensitive layer.

(Sensitizing Dye)

A sensitizing dye may also be used in the photosensitive layer of the lithographic printing plate precursor that is subjected to imagewise exposure with a light source to emit light of from 250 to 420 nm, as combined with the above-mentioned polymerization initiator, thereby increasing the radical generation efficiency of the initiator.

Examples of the sensitizing dye are benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, benzil, dibenzalacetone, p-(dimethylamino)phenyl styryl ketone, p-(dimethylamino) phenyl p-methylstyryl ketone, benzophenone, p-(dimethylamino)benzophenone (or Michler's ketone), p-(diethylamino)benzophenone, benzanthrone, 2,5-bis(4-diethylaminophenyl)-1,3,4-oxadiazole.

The sensitizing dye may be added to the photosensitive layer preferably in an amount of from 0.1 to 50% by mass relative to the solid content of the layer, more preferably from 0.5 to 30% by mass, even more preferably from 0.8 to 20% by mass.

(Polymerizing Compound)

The polymerizing compound to be used in the photosensitive layer in the invention is an addition-polymerizing compound having at least one ethylenic unsaturated double bond, and is selected from compounds having at least one, preferably at least two terminal ethylenic unsaturated bonds. The compound group of the type is widely known in this industrial field, and in the invention, these may be used with no specific limitation. These have chemical morphologies of, for example, monomer, prepolymer, or that is, dimer, trimer and oligomer, and their mixture and copolymer. Examples of the monomer and its copolymer are unsaturated carboxylic acids (e.g., acrylic acid, methacrylic acid, itaconic acid, crotonic acid, isocrotonic acid, maleic acid), and their esters and amides; and preferred are esters of unsaturated carboxylic acids and aliphatic polyalcohol compounds, and amides of unsaturated carboxylic acids and aliphatic polyamine compounds. Also preferred for use herein are addition reaction products of unsaturated carboxylic acid esters or amides having a nucleophilic substituent such as a hydroxyl group, an amino group or a mercapto group, and monofunctional or polyfunctional isocyanates or epoxides; and dewatered condensates thereof with monofunctional or polyfunctional carboxylic acids. Also preferred are addition reaction products of unsaturated carboxylic acid esters or amides having an electrophilic substituent such as an isocyanate group or an epoxy group, and monofunctional or polyfunctional alcohols, amines or thiols; and substitution reaction products of unsaturated carboxylic acid esters or amides having a leaving substituent such as a halogen group or a tosyloxy group, and monofunctional or polyfunctional alcohols, amines or thiols. As other examples, also usable is a compound group derived from the above compounds by substituting the unsaturated carboxylic acids with unsaturated phosphonic acids, styrene, vinyl ether or the like.

(Microcapsules)

In the invention, for introducing the above-mentioned, photosensitive layer-constitutive ingredients and other constitutive ingredients mentioned below, into the photosensitive layer, for example, employable is a method of encapsulating a part of the constitutive ingredients in microcapsules and adding them to the layer, as in JP-A 2001-277740, 2001-277742. In this case, the constitutive ingredients may be in any desired ratio inside and outside the microcapsules.

The microcapsule wall preferred for use in the invention has a three-dimensional crosslink structure and has a property of swelling with solvent. From this viewpoint, the microcapsule wall material is preferably polyurea, polyurethane, polyester, polycarbonate, polyamide and their mixture; and more preferred are polyurea and polyurethane. If desired, the above-mentioned compound having a crosslinking functional group such as an ethylenic unsaturated bond, which is introducible into the water-insoluble compound, may also be introduced into the microcapsule wall.

Preferably, the mean particle size of the microcapsules is from 0.01 to 3.0 µm, more preferably from 0.05 to 2.0 µm, even more preferably from 0.10 to 1.0 µM. Within the range, they enjoy good resolution and stability with time.

(Other Ingredients of Photosensitive Layer)

If desired, the photosensitive layer of the invention may contain various additives.

They are described below.

(Surfactant)

In the invention, the photosensitive layer preferably contains a surfactant for promoting the developability and improving the coating surface profile thereof. The surfactant includes nonionic surfactants, anionic surfactants, cationic surfactants, ampholytic surfactants, fluorine-containing surfactants. One or more such surfactants may be used herein either singly or as combined.

(Hydrophilic Polymer)

In the invention, the layer may contain a hydrophilic polymer for improving the developability thereof and for improving the dispersion stability of the microcapsules therein.

As the hydrophilic polymer, for example, preferred are those having a hydrophilic group such as a hydroxyl group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group, a phosphoric acid group.

The hydrophilic polymer preferably has a weight-average molecular weight of at least 5000, more preferably from 10,000 to 300,000. The hydrophilic polymer may be any of random polymer, block polymer, graft polymer.

The content of the hydrophilic polymer in the photosensitive layer is preferably at most 20% by mass of the overall solid content of the layer, more preferably at most 10% by mass.

(Colorant)

In the invention, usable is a dye having a large absorption within a visible light range, as an image colorant. Concretely, it includes Oil Yellow #101, Oil Yellow #103, Oil Pink #312, Oil Green BG, Oil Blue BOS, Oil Blue #603, Oil Black BY, Oil Black BS, Oil Black T-505 (all by Orient Chemical Industry); Victoria Pure Blue, Crystal Violet (CI 12555), Methyl Violet (CI 42535), Ethyl Violet, Rhodamine B (CI 145170 B), Malachite Green (CI 42000), Methylene Blue (CI 52015); and dyes described in JP-A 62-293247. In addition, pigments such as phthalocyanine pigments, azo pigments, carbon black and titanium oxide are also preferably used herein.

It is desirable to add the colorant as capable of facilitating the differentiation of the image area and the non-image area after image formation. Preferably, the amount of the colorant to be added is in a ratio of from 0.01 to 10% by mass relative to the overall solid content of the image-recording material.

(Bakeout Agent)

A compound capable of changing its color by acid or radical may be added to the photosensitive layer in the invention for bake-out image formation. As the compound, for example, effectively usable are various dyes such as diphenylmethane dyes, triphenylmethane dues, thiazine dyes, oxazine dyes, xanthene dyes, anthraquinone dyes, iminoquinone dyes, azo dyes, azomethine dyes.

A preferred amount of the dye capable of changing its color by acid or radical is in a ratio of from 0.01 to 15% by mass relative to the solid content of the photosensitive layer.

(Polymerization Inhibitor)

Preferably, a small amount of a thermal polymerization inhibitor is added to the photosensitive layer in the invention for preventing any unnecessary thermal polymerization of the radical polymerizing compound in the layer during production or storage of the photosensitive layer.

Preferred examples of the thermal polymerization inhibitor are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitroso-N-phenylhydroxylamine aluminium salt.

The amount of the thermal polymerization inhibitor to be added is preferably from about 0.01 to about 5% by mass relative to the overall solid content of the photosensitive layer.

(Higher Fatty Acid Derivative, Etc.)

A higher fatty acid derivative or the like, such as behenic acid or behenylamide may be added to the photosensitive layer in the invention for preventing polymerization retardation by oxygen whereby the derivative may be localized on the surface of the photosensitive layer during the drying process after its coating. The amount of the higher fatty acid derivative is preferably from about 0.1 to about 10% by mass relative to the overall solid content of the photosensitive layer.

(Plasticizer)

The photosensitive layer in the invention may contain a plasticizer. As the plasticizer, for example, preferred are phthalates such as dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate, diallyl phthalate; glycol esters such as dimethylglycol phthalate, ethylphthalylethyl glycolate, methylphthalylethyl glycolate, butylphthalylbutyl glycolate, triethyleneglycol dicaprylate; phosphates such as tricresyl phosphate, triphenyl phosphate; aliphatic dibasic acid esters such as diisobutyl adipate, dioctyl adipate, dimethyl sebacate, dibutyl sebacate, dioctyl azelate, dibutyl maleate; polyglycidyl methacrylate, triethyl citrate, triacetyl glycerin, butyl laurate. The content of the plasticizer is preferably at most about 30% by mass relative to the overall solid content of the photosensitive layer.

(Inorganic Particles)

The photosensitive layer in the invention may contain inorganic particles for improving the cured film strength in the image area thereof. As the inorganic particles, for example, preferred are silica, alumina, magnesium oxide, titanium oxide, magnesium carbonate, calcium alginate, and their mixtures. Even though they do not have a property of photothermal conversion, they may be used for film strengthening and for surface roughening for interfacial adhesiveness enhancement. Preferably, the inorganic particles have a mean particle size of from 5 nm to 10 μm, more preferably from 0.5 to 3 μm. Within the range, the particles may stably disperse in the photosensitive layer to fully keep the film strength of the layer, thereby forming a non-image area of good hydrophilicity that is hardly contaminated during printing.

The above-mentioned inorganic particles are readily available as commercial products such as colloidal silica dispersion.

The content of the inorganic particles is preferably at most 20% by mass relative to the overall solid content of the photosensitive layer, more preferably at most 10% by mass.

(Low-Molecular Hydrophilic Compound)

The photosensitive layer in the invention may contain a hydrophilic low-molecular compound for improving the developability thereof. The hydrophilic low-molecular compound include, for example, as water-soluble organic compounds, glycols such as ethylene glycol, diethylene glycol, triethylene glycol, propylene glycol, dipropylene glycol, tripropylene glycol, and their ether or ester derivatives, polyhydroxy compounds such as glycerin, pentaerythritol, organic amines such as triethanolamine, diethanolamine, monoethanolamine, and their salts, organic sulfonic acids such as toluenesulfonic acid, benzenesulfonic acid, and their salts, organic phosphonic acids such as phenylphosphonic acid, and their salts, organic carboxylic acids such as tartaric acid, oxalic acid, citric acid, malic acid, lactic acid, gluconic acid, amino acids, and their salts, and organic quaternary ammonium salts such as tetraethylamine hydrochloride.

In addition to the above, the photosensitive layer in the invention may contain, for example, a co-sensitizer.

<Formation of Photosensitive Layer>

The photosensitive layer in the invention may be formed by dispersing or dissolving the above-mentioned necessary ingredients in a solvent to prepare a coating liquid, and applying it to a support. The solvent to be used includes ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, water, to which, however, the invention should not be limited. One or more such solvents may be used either singly or as combined. The solid concentration of the coating liquid is preferably from 1 to 50% by mass.

The photosensitive layer in the invention may be formed by dispersing or dissolving the above-mentioned, same or different ingredients in the same or different solvents to prepare plural coating liquids, and repeatedly coating them to a support and drying them in plural times.

The coating amount of the photosensitive layer (solid content) formed on the support after coating and drying may vary depending on the use of the layer, but in general, it is preferably from 0.3 to 3.0 g/m². Within the range, the layer may have good sensitivity and may form an image-recording layer having good film properties.

Various coating methods may be employed. For example, employable are methods of bar coating, spin coating, spray coating, curtain coating, dip coating, air knife coating, blade coating or roll coating.

<Protective Layer>

Preferably, a protective layer (oxygen-shielding layer) is provided on the photosensitive layer of the lithographic printing plate precursor in the invention, for the purpose of preventing oxygen, which interferes with polymerization during exposure to light, from diffusing and penetrating into the precursor. The protective layer in the invention preferably has an oxygen permeability A at 25° C. under one atmospheric pressure, as follows: $1.0 \leqq A \leqq 20$ (mL/m²·day). When the oxygen permeability A is lower than 1.0 (mL/m²·day) and is extremely low, then it may cause some problems in that unnecessary polymerization may occur during production and storage of the raw precursor and unnecessary fogging and line thickening may occur during imagewise exposure thereof. On the contrary, when the oxygen permeability A is larger than 20 (mL/m²·day) and is too high, then it may cause reduction in the sensitivity of the layer. More preferably, the oxygen permeability A falls within a range of $1.5 \leqq A \leqq 12$ (mL/m²·day), even more preferably $2.0 \leqq A \leqq 10.0$ (mL/m²·day). The desirable characteristics of the protective layer are that, in addition to the above-mentioned oxygen permeability limitation, it does not substantially interfere with the transmittance of light used for exposure, that it has good adhesiveness to the photosensitive layer, and that it may be readily removed in the development step after exposure. Various devices have heretofore been made for the protective layer, as described in detail in U.S. Pat. No. 3,458,311, JP-B 55-49729.

The material usable for the protective layer is, for example, preferably a water-soluble polymer compound having relatively good crystallinity. Concretely, it includes water-soluble polymers such as polyvinyl alcohol, vinyl alcohol/vinyl phthalate copolymer, vinyl acetate/vinyl alcohol/vinyl phthalate copolymer, vinyl acetate/crotonic acid copolymer, polyvinylpyrrolidone, acidic celluloses, gelatin, gum arabic, polyacrylic acid, polyacrylamide. One or more of these may be used either singly or as combined. Of those, preferred is a polymer comprising polyvinyl alcohol as the main ingredient thereof, as giving the best results of basic characteristics such as oxygen shieldability and removability in development.

Further, it is also desirable that the protective layer of the lithographic printing plate precursor in the invention contains an inorganic layered compound for improving the oxygen shieldability and the photosensitive layer surface-protecting ability thereof.

The inorganic layered compound as referred to herein is a particulate compound having a thin and tabular morphology, including, for example, a mica group such as natural mica and synthetic mica represented by the following general formula:

[wherein A is any of K, Na or Ca; B and C each are any of Fe(II), Fe(III), Mn, Al, Mg or V; D is Si or Al]; talc represented by a formula, 3MgO.4SiO.H₂O; teniolite, montmorillonite, saponite, hectorite, zirconium phosphate.

In the above mica group, the natural mica includes muscovite, soda mica, phlogopite, biotite, rosasite. The synthetic mica includes non-swelling mica such as fluorophlogopite $KMg_3(AlSi_3O_{10})F_2$, potassium tetrasilicon mica $KMg_{2.5}(Si_4O_{10})F_2$, and swelling mica such as Na tetrasilicic mica $NaMg_{2.5}(Si_4O_{10})F_2$, Na or Li teniolite $(Na,Li)Mg_2Li(Si_4O_{10})F_2$, montmorillonite-type Na or Li hectorite $(Na,Li)_{1/8}Mg_{2/5}Li_{1/8}(Si_4O_{10})F_2$. Further, synthetic smectite is also useful.

Regarding the particle size of the inorganic layered compound for use in the invention, the mean major diameter thereof may be from 0.3 to 20 μm, preferably from 0.5 to 10 μm, more preferably from 1 to 5 μm. The mean thickness of the particles may be at most 0.1 μm, preferably at most 0.05 μm, more preferably at most 0.01 μm. For example, the size of swelling synthetic mica, a typical compound of the inorganic layered compound may be such that its thickness is from 1 to 50 nm and its plane size is from 1 to 20 μm or so.

Thus prepared, the coating liquid for protective layer is applied onto the photosensitive layer formed on a support, and dried to form a protective layer. The coating solvent may be suitably selected in relation to the binder. When a water-soluble polymer is used, then distilled water or pure water is preferably used. The coating method for the protective layer is not specifically defined, for which, for example, employable is any known method such as those described in U.S. Pat. No. 3,458,311 or JP-B 55-49729. Concretely, for example, the protective layer may be formed according to a blade coating method, an air knife coating method, a gravure coating method, a roll coating method, a spray coating method, a dip coating method, or a bar coating method.

Preferably, the coating amount of the protective layer is from 0.05 to 10 g/m² as the dry coating amount thereof. In case where the layer contains an inorganic layered compound, the amount is more preferably from 0.1 to 0.5/m²; and in case where it does not contain an inorganic layered compound, the amount is more preferably from 0.5 to 5 g/m².

<Support>

Not specifically defined, the support for use in the lithographic printing plate precursor in the invention may be any tabular hydrophilic support having dimensional stability. For example, it includes paper, paper laminated with a plastic (e.g., polyethylene, polypropylene, polystyrene), metal plates (e.g., aluminum zinc, copper), plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), paper or plastic films laminated or deposited with the above-mentioned metal. As the support, preferred are polyester film and aluminium plate. Above all, more preferred is aluminium plate as it has good dimensional stability and is relatively inexpensive.

The thickness of the support is preferably from 0.1 to 0.6 mm, more preferably from 0.15 to 0.4 mm, even more preferably from 0.2 to 0.3 mm.

The surface of the aluminum plate may be roughened in various methods. For example, it may be roughened through mechanical roughening treatment, electrochemical roughening treatment (roughening treatment by electrochemically etching the surface), chemical roughening treatment, (roughening treatment by selective chemical surface etching).

For mechanical surface-roughening treatment, employable is any known method of ball-polishing, brush-polishing, blast-polishing or buff-polishing.

For electrochemical surface-roughening treatment, for example, employable is a method of processing a support in an electrolytic solution containing an acid such as hydrochloric acid or nitric acid with an alternating current or a direct current. In addition, the method of using a mixed acid, as in JP-A 54-63902, is also employable.

The surface-roughened aluminum plate may be, if desired, alkali-etched with an aqueous solution of potassium hydroxide or sodium hydroxide, then neutralized, and thereafter subjected to anodic oxidation for improving the abrasion resistance thereof.

The electrolyte to be used in anodic oxidation treatment of aluminum plate may be any one capable of forming a porous oxide film. In general, usable are sulfuric acid, hydrochloric acid, oxalic acid, chromic acid or their mixed acids. The concentration of the electrolyte may be suitably determined depending on the type of the electrolyte.

The condition of anodic oxidation varies depending on the electrolyte used, and therefore could not be indiscriminately determined. In general, the condition is preferably as follows: The electrolytic solution has an electrolyte concentration of from 1 to 80% by mass, the liquid temperature is from 5 to 70° C., the current density is from 5 to 60 A/dm$^2$, the voltage is from 1 to 100 V, and the electrolyte time is from 10 seconds to 5 minutes. The amount of the anodic oxidation film to be formed is preferably from 1.0 to 5.0 g/m$^2$, more preferably from 1.5 to 4.0 g/m$^2$. Within the range, the lithographic printing plate may have good printing resistance, and its non-image area way have good scratch resistance.

As the support, the substrate having the above-mentioned film formed through the surface treatment of anodic oxidation may be used directly as it is, but if desired, it may be further processed for further improving the adhesiveness thereto to the overlying layer, the hydrophilicity, the contamination resistance and the heat-insulating property thereof. The treatment may be suitably selected from treatment for enlarging micropores in the anode oxidation film, treatment of sealing up micropores therein, or treatment of surface hydrophilication by dipping in an aqueous solution containing a hydrophilic compound, as in JP-A 2001-253181, 2001-322365. Needless-to-say, the enlargement treatment and the pore-sealing treatment are not limited to those described in the reference, for which usable is any known method.

For the hydrophilication treatment, employable is an alkali metal silicate method as in U.S. Pat. Nos. 2,714,066, 3,181, 461, 3,280,734, 3,902,734. According to the method, a support is dipped in an aqueous solution of sodium silicate or the like or electrolyzed. Apart from it, also employable are a method of processing with potassium fluorozirconate as in JP-B 36-22063; and a method of processing with polyvinylphosphonic acid as in U.S. Pat. Nos. 3,276,868, 4,153,461, 4,689,272.

<Undercoat Layer>

In the lithographic printing plate precursor in the invention, an undercoat layer of a compound containing a polymerizing group is preferably provided on the support. In case where an undercoat layer is provided, the photosensitive layer is formed on the undercoat layer. The undercoat layer is to enhance the adhesiveness between the support and the photosensitive layer in the exposed area but to facilitate the peeling of the photosensitive layer from the support in the non-exposed area, therefore improving the developability of the precursor.

Concretely, for the undercoat layer, preferred are a silane coupling agent having an addition-polymerizing ethylenic double bond reactive group as in JP-A 10-282679, and the phosphorus compound having an ethylenic double bond reactive group as in IP-A 2-304441. Especially preferred is a compound having a polymerizing group such as a methacryl group or an allyl group, and a support-adsorbing group such as a sulfonic acid group, a phosphoric acid group or a phosphate group. Also preferred is a compound having a hydrophilicity-imparting group such as an ethyleneoxide group in addition to the polymerizing group and the support-adsorbing group.

Preferably, the coating amount (solid content) of the undercoat layer is from 0.1 to 100 mg/m$^2$, more preferably from 1 to 30 mg/m$^2$.

<Backcoat Layer>

After the support is surface-treated or coated with an undercoat layer, if desired, its back may be coated with a backcoat layer.

As the backcoat layer, for example, preferred is a coating layer of an organic polymer compound as in JP-A 545885, or a metal oxide obtained through hydrolysis and polycondensation of an organic metal compound or an inorganic metal compound as in JP-A 6-35174. Above all, preferred is a silicon alkoxide compound such as $Si(OCH_3)_4$, $Si(OC_2H_5)_4$, $Si(OC_3H_7)_4$, $Si(OC_4H_9)_4$ as its starting materials are inexpensive and readily available.

According to the invention, lithographic printing plates of constant quality can be manufactured not producing a problem of contamination inside the automatic developing apparatus and not producing a problem of refuse deposition.

In addition, since the liquid level of the developer is always kept constant, good processing can be attained all the time; and since the developed is circulated and used, the running cost may be reduced owing to the reduction in the developer replenisher and owing to the reduction in the waste amount; and further, another advantage of the automatic developing machine is that lithographic printing plates favorable from the environmental viewpoint can be manufactured with it.

What is claimed is:

1. A dipping-type automatic developing apparatus for a lithographic printing plate, comprising:
   a first tank containing developer liquid, in which a lithographic printing plate precursor having an imagewise-exposed image-recording layer on a surface-roughened aluminum support having an anodic oxidation film is dipped and desensitization is performed simultaneously with the removal of a non-image area of the imagewise-exposed image-recording layer; and
   a second tank containing developer liquid,
   wherein
   developer liquid is circulated between the first tank forming a processing path line for the lithographic printing plate and the second tank provided outside the processing path line so that the liquid level in the first tank may be held constant.

2. The dipping-type automatic developing apparatus according to claim 1, wherein
   the developer in the second tank contains a surfactant in an amount of from 3 to 20% by mass and has a pH of from 4 to 9.5.

3. The dipping-type automatic developing apparatus according to claim 2, wherein
the developer in the second tank contains a water-soluble resin in an amount of from 1 to 10% by mass.

4. The dipping-type automatic developing apparatus according to claim 1, further comprising:
a lead-in roller provided upstream in a conveying direction inside the first tank; and
a lead-out roller provided downstream in the conveying direction inside the first tank,
wherein the first tank has a closed structure by providing a blade as kept in contact the with the lead-in roller and providing a blade as kept in contact the with the lead-out roller.

5. The dipping-type automatic developing apparatus according to claim 1, further comprising:
a rubbing member which rotates in a state where at least a part of the rubbing member is kept dipped in the developer in the first tank to remove the non-image area.

6. The dipping-type automatic developing apparatus according to claim 5, wherein
the removal of the non-image area by rotation of the rubbing member is performed at least 2 seconds after a part of the lithographic printing plate precursor to be subjected to the removal is contacted with the developer in the first tank.

7. The dipping-type automatic developing apparatus according to claim 6, wherein
the rubbing member is disposed in a last half of the first tank in the conveying direction.

8. The dipping-type automatic developing apparatus according to claim 4, further comprising:
a spray for spraying the developer in the second tank is disposed near downstream of the lead-in roller or the lead-out roller.

9. The dipping-type automatic developing apparatus according to claim 1, further comprising, in upstream of the first tank:
at least one of a heating unit that heats the lithographic printing plate precursor and prerinsing unit that removes a protective layer if the lithographic printing plate precursor has the protective layer on a photosensitive layer.

10. The dipping-type automatic developing apparatus according to claim 1, wherein
the developer in the second tank has a pH of from 2 to 10.

11. A dipping-type automatic developing method for a lithographic printing plate, comprising:
dipping a lithographic printing plate precursor having an imagewise-exposed image-recording layer in a first tank containing a developer to remove a non-image area of the imagewise-exposed image-recording layer;
circulating the developer in the first tank and a developer in a second tank into each other to keep constant a liquid level of the developer in the first tank, the first tank forming a processing path line for the lithographic printing plate and the second provided outside the processing path line; and
designing the developer in the second tank to contain a surfactant in amount of from 3 to 20% by mass, have a pH of from 2 to 10, and further contain a water-soluble resin in an amount of from 1 to 10% by mass.

12. The dipping-type automatic developing method according to claim 11, wherein
the developer in the second tank is designed to have a pH of from 4 to 9.5.

13. The dipping-type automatic developing method for a lithographic printing plate according to claim 11, wherein desensitization is performed simultaneously with removal of a non-image area.

* * * * *